(12) United States Patent
Choi et al.

(10) Patent No.: US 9,887,202 B2
(45) Date of Patent: *Feb. 6, 2018

(54) SEMICONDUCTOR DEVICE AND METHOD OF MANUFACTURING THE SAME

(71) Applicant: Samsung Electronics Co., Ltd., Suwon-si (KR)

(72) Inventors: Hyun-Min Choi, Uiwang-si (KR); Shigenobu Maeda, Seongnam-si (KR); Jihoon Yoon, Seoul (KR); Sungman Lim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/334,411

(22) Filed: Oct. 26, 2016

(65) Prior Publication Data
US 2017/0047335 A1 Feb. 16, 2017

Related U.S. Application Data

(63) Continuation of application No. 14/532,152, filed on Nov. 4, 2014, now Pat. No. 9,502,425.

(30) Foreign Application Priority Data

Nov. 4, 2013 (KR) .......................... 10-2013-0133074

(51) Int. Cl.
| H01L 29/78 | (2006.01) |
| H01L 27/112 | (2006.01) |
| H01L 29/06 | (2006.01) |
| H01L 29/423 | (2006.01) |
| H01L 23/522 | (2006.01) |
| H01L 23/525 | (2006.01) |
| H01L 27/02 | (2006.01) |

(52) U.S. Cl.
CPC .... *H01L 27/11206* (2013.01); *H01L 23/5226* (2013.01); *H01L 23/5252* (2013.01); *H01L 29/0649* (2013.01); *H01L 29/0653* (2013.01); *H01L 29/42372* (2013.01); *H01L 29/7851* (2013.01); *H01L 27/0207* (2013.01); *H01L 29/785* (2013.01)

(58) Field of Classification Search
CPC ......... H01L 27/11206; H01L 29/42372; H01L 29/7851; H01L 27/0207
USPC ....................................................... 257/369
See application file for complete search history.

(56) References Cited

U.S. PATENT DOCUMENTS 5,946,563 A 8/1999 Ueahara et al.
6,130,469 A 10/2000 Bracchitta et al.
(Continued)

*Primary Examiner* — Fernando L Toledo
*Assistant Examiner* — Adam S Bowen
(74) *Attorney, Agent, or Firm* — Muir Patent Law, PLLC

(57) ABSTRACT

The inventive concepts provide semiconductor devices and methods of manufacturing the same. One semiconductor device includes a substrate, a device isolation layer disposed on the substrate, a fin-type active pattern defined by the device isolation layer and having a top surface higher than a top surface of the device isolation layer, a first conductive line disposed on an edge portion of the fin-type active pattern and on the device isolation layer adjacent to the edge portion of the fin-type active pattern, and an insulating thin layer disposed between the fin-type active pattern and the first conductive line. The first conductive line forms a gate electrode of an anti-fuse that may be applied with a write voltage.

21 Claims, 40 Drawing Sheets

(56) References Cited

U.S. PATENT DOCUMENTS

| | | |
|---|---|---|
| 7,087,499 B2 | 8/2006 | Rankin et al. |
| 7,309,634 B2 | 12/2007 | Hong |
| 7,456,426 B2 | 11/2008 | Breitwisch et al. |
| 7,691,684 B2 | 4/2010 | Breitwisch et al. |
| 7,723,786 B2 | 5/2010 | Kakoschke et al. |
| 8,030,736 B2 | 10/2011 | Booth, Jr. et al. |
| 8,305,790 B2 | 11/2012 | Chung et al. |
| 8,324,668 B2 | 12/2012 | Huang et al. |
| 2007/0029576 A1 | 2/2007 | Nowak et al. |
| 2009/0184350 A1 | 7/2009 | Kodama et al. |
| 2012/0044746 A1 | 2/2012 | Chung |
| 2014/0346603 A1 | 11/2014 | Toh et al. |

SEMICONDUCTOR DEVICE AND METHOD OF MANUFACTURING THE SAME

CROSS-REFERENCE TO RELATED APPLICATION

This U.S. non-provisional patent application is a continuation application of U.S. patent application Ser. No. 14/532,152, filed Nov. 4, 2014, which claims priority under 35 U.S.C. §119 to Korean Patent Application No. 10-2013-0133074, filed on Nov. 4, 2013, in the Korean Intellectual Property Office, the disclosures of each of which are hereby incorporated by reference in their entirety.

BACKGROUND

This disclosure relates to semiconductor devices and methods of manufacturing the same, more particularly, to semiconductor devices including one-time programmable elements and methods of manufacturing the same.

Non-volatile memory devices may be classified into one-time programmable (OTP) devices and multi-time programmable (MTP) devices. Only one programming operation may be performed on the OPT device due to an inner circuit of the OPT device. Therefore, an additional programming operation may not be performed on the OTP device. The OTP devices may include, for example, a fuse, an anti-fuse, and an electrically programmable fuse (e-fuse). In some cases, it may be impossible to erase data programmed in the OPT device.

The OPT devices may be used in security systems because of their aforementioned characteristics. Recently, high-performance OPT devices have been increasingly demanded.

SUMMARY

Embodiments of the inventive concepts may provide high-performance semiconductor devices.

Embodiments of the inventive concepts may also provide methods of manufacturing a high-performance semiconductor device.

In one aspect, a semiconductor device may include: a substrate; a device isolation layer on the substrate; a fin-type active pattern defined by the device isolation layer, the fin-type active pattern extending in a first direction, and the fin-type active pattern having a top surface higher than a top surface of the device isolation layer; a first conductive line on an edge portion of the fin-type active pattern and on the device isolation layer adjacent to the edge portion of the fin-type active pattern; and an insulating thin layer between the fin-type active pattern and the first conductive line. The first conductive line may form a gate electrode of an anti-fuse to which a write voltage is applied.

In some embodiments, the fin-type active pattern may further include: a center portion disposed between both edge portions of the fin-type active pattern. In this case, the semiconductor device may further include: a second conductive line disposed on the center portion of the fin-type active pattern.

In some embodiments, the second conductive line pattern may form a gate electrode on which a read operation is performed.

In some embodiments, the semiconductor device may further include: dopant regions in the fin-type active pattern exposed by the first and second conductive lines; and a bit line electrically connected to the dopant region adjacent to the second conductive line.

In some embodiments, the insulating thin layer under the first conductive line pattern may be configured to break in order to electrically connect the first conductive line to the fin-type active pattern when a ground voltage is applied to the first conductive line and the substrate, a first voltage is applied to the first conductive line, and a second voltage lower than the first voltage is applied to the second conductive line.

In some embodiments, the fin-type active pattern may include a plurality of fin-type active patterns. The fin-type active patterns may constitute a plurality of columns parallel to a second direction perpendicular to the first direction, and the fin-type active patterns constituting one column may be spaced apart from the fin-type active patterns constituting anther column in the first direction. The fin-type active patterns in each column may be spaced apart from each other in the second direction.

In some embodiments, the device isolation layer may include a first device isolation region between the fin-type active patterns adjacent to each other in the first direction, and a second device isolation region between the fin-type active patterns adjacent to each other in the second direction.

In some embodiments, the first conductive line may cross over the edge portion of the fin-type active pattern and the first device isolation region. The semiconductor device may further include: a second conductive line crossing over a center portion between both edge portions of the fin-type active pattern and the second device isolation region.

In some embodiments, the fin-type active pattern may include a first portion having a first thickness from the substrate and a second portion having a second thickness smaller than the first thickness from the substrate, and the first conductive line may disposed on the first portion of the fin-type active pattern. In this case, the semiconductor device may further include: a dopant pattern disposed on the second portion of the fin-type active pattern.

In some embodiments, the insulating thin layer may surround a bottom surface and both sidewalls of the first conductive line.

In one embodiment, the first conductive line covers at least a first point corner portion of the fin-type active pattern.

In another aspect, a semiconductor device includes: a substrate; a device isolation layer on the substrate; a plurality of fin-type active patterns, including a first fin-type active pattern, defined by the device isolation layer, the first fin-type active pattern extending in a first direction parallel to an upper surface of the substrate, and the fin-type active pattern having a top surface higher than a top surface of the device isolation layer; a first conductive line disposed on an edge portion of the fin-type active pattern and on the device isolation layer adjacent to the edge portion of the fin-type active pattern, the first conductive line continuously covering a top surface of the edge portion of the first fin-type active pattern, an end sidewall of the edge portion of the first fin-type active pattern, and a terminal edge between the top surface and the end sidewall; and an insulating layer between the fin-type active pattern and the first conductive line, wherein the first conductive line and insulating layer are part of an anti-fuse.

In one embodiment, the first conductive line covers at least a first point corner portion of the fin-type active pattern.

In one embodiment, the insulating layer is configured to break at a region corresponding to the first point corner portion of the first fin-type active pattern when a voltage above a particular threshold is applied to the first conductive line.

In one embodiment, the insulating layer is conformally formed on the first fin-type active pattern. In one embodiment, the insulating layer is conformally formed on the first conductive line.

In one embodiment, the first fin-type pattern and first conductive line are part of a first write transistor, the first conductive line being a gate electrode of the first write transistor.

In still another aspect, a semiconductor device may include: a substrate including a device isolation layer defining active patterns, the device isolation layer having a top surface lower than top surfaces of the active patterns; a first anti-fuse comprising a first gate electrode crossing over the active patterns on edge portions of the active patterns, the first gate electrode for receiving a first voltage; a first transistor comprising a second gate electrode crossing over center portions of the active patterns, the second gate electrode for receiving a second voltage lower than the first voltage; and a bit line electrically connected to the first transistor. The first gate electrode may include a first portion on the active patterns and a second portion on the device isolation layer.

In some embodiments, the first anti-fuse may further include: a first insulating layer between the substrate and the first gate electrode; and a first dopant pattern at one side of the first gate electrode, and the first transistor may further include: a second insulating layer between the substrate and the second gate electrode; and second dopant patterns at both sides of the second gate electrode. The first insulating layer may be broken such that the first anti-fuse is one-time programmed when the first and second voltages are applied to the first and second gate electrodes, respectively.

In some embodiments, the first and second dopant patterns may have top surfaces higher than top surfaces of the active patterns disposed under the first and second gate electrodes.

BRIEF DESCRIPTION OF THE DRAWINGS

The disclosed embodiments will become more apparent in view of the attached drawings and accompanying detailed description.

FIGS. 4A through 8A are perspective views illustrating a method of manufacturing a semiconductor device according to some embodiments of the inventive concepts;

FIGS. 4B through 8B are exemplary plan views corresponding to FIGS. 4A through 8A, respectively;

FIGS. 4C through 8C are exemplary cross-sectional views taken along lines I-I' of FIGS. 4B through 8B, respectively;

FIGS. 4D through 8D are cross-sectional views taken along lines II-II' of FIGS. 4B through 8B, respectively;

FIGS. 9A through 13A are perspective views illustrating a method of manufacturing a semiconductor device according to other embodiments of the inventive concepts;

FIGS. 9B through 13B are exemplary plan views corresponding to FIGS. 9A through 13A, respectively;

FIGS. 9C through 13C are exemplary cross-sectional views taken along lines I-I' of FIGS. 9B through 13B, respectively; and FIGS. 9D through 13D are exemplary cross-sectional views taken along lines II-II' of FIGS. 9B through 13B, respectively.

DETAILED DESCRIPTION

Figure 1A:
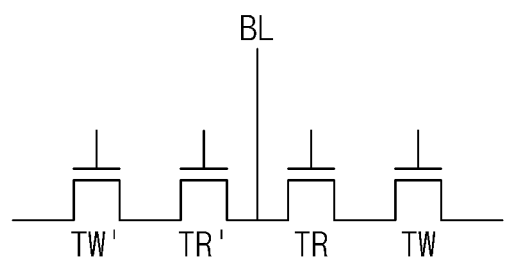
FIGS. 1A and 1B are circuit diagrams illustrating a semiconductor device according to some embodiments of the inventive concepts.

This disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Similarly, unless the context indicates otherwise, the term "contact" refers to two items touching, without any intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present disclosure. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1B:
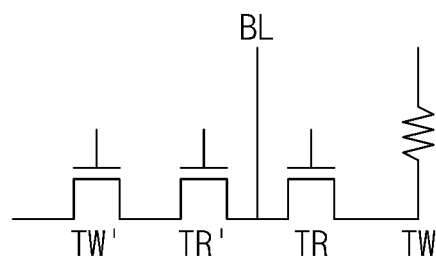

FIGS. 1A and 1B are circuit diagrams illustrating a semiconductor device according to some embodiments of the inventive concepts.

Referring to FIG. 1A, a semiconductor device according to certain embodiments includes a plurality of transistor structures (e.g., TW, TR, TW' and TR') and a bit line (e.g., BL). For example, one bit line BL may be electrically connected to four transistor structures TW, TR, TW' and TR'.

Two transistor structures TW and TR may function as one bit. For example, one transistor structure TW of the two transistor structures TW and TR may be used in a write operation, and the other transistor structure TR of the two transistor structures TW and TR may be used for a read operation. The transistor structure TR may be a transistor for the read operation and may be disposed to be adjacent to the bit line BL. The transistor structure TW may be, for example, an anti-fuse.

For example, the four transistor structures TW, TR, TW' and TR' (i.e., two transistor structures TW and TW' for the write operation, and two transistor structures TR and TR' for the read operation) may constitute one cell (e.g., one memory cell). Adjacent cells may be insulated from each other.

FIG. 1B is a circuit diagram illustrating a programmed semiconductor device according to embodiments of the inventive concepts. Hereinafter, one bit will be described as an example.

Referring to FIG. 1B, a ground voltage may be applied to the bit line BL and a substrate on which the two transistor structures TR and TW constituting the one bit are formed. A turn-on voltage $V_{turn-on}$ may be applied to the transistor TR for the read operation, and a voltage $V_{high}$ higher than the turn-on voltage $V_{turn-on}$ may be applied to the transistor structure TW for the write operation. For example, a voltage of about 2V may be applied to the transistor TR for the read operation, and a voltage of about 5V may be applied to the transistor structure TW for the write operation.

When the voltages such as described above are applied, a breakdown phenomenon may occur in an insulating thin layer (e.g., an oxide layer) between an active region and a gate electrode of the transistor structure TW applied with the high voltage (see, e.g., FIG. 2E, discussed further below). Thus, the transistor structure TW for the write operation may be changed into a resistor, thus functioning as an anti-fuse, and the one bit may be programmed by a resistance difference of the transistor structure TW for the write operation.

Figure 2A:
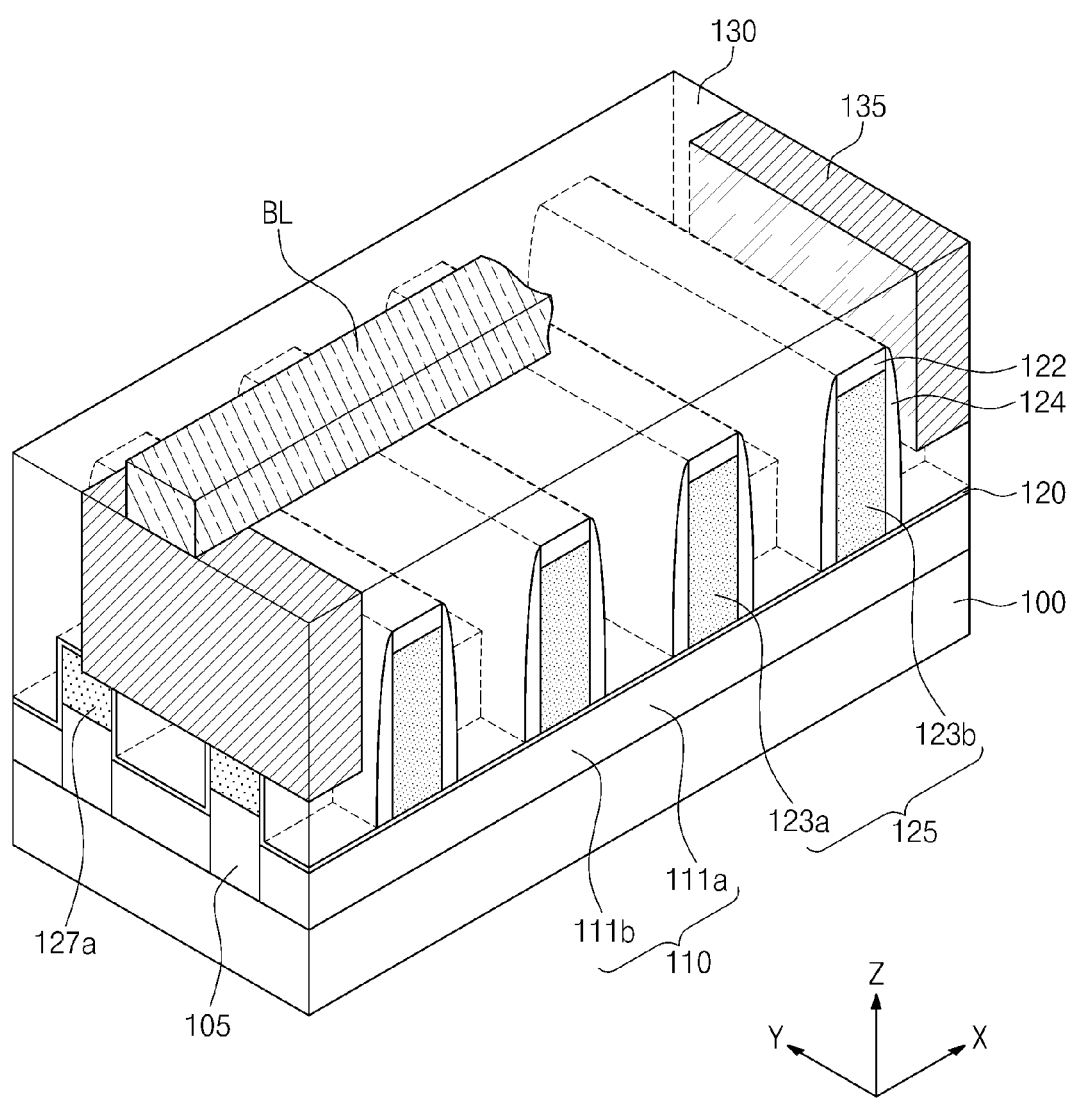
FIG. 2A is a perspective view illustrating a semiconductor device according to some embodiments of the inventive concepts.
Figure 2B:
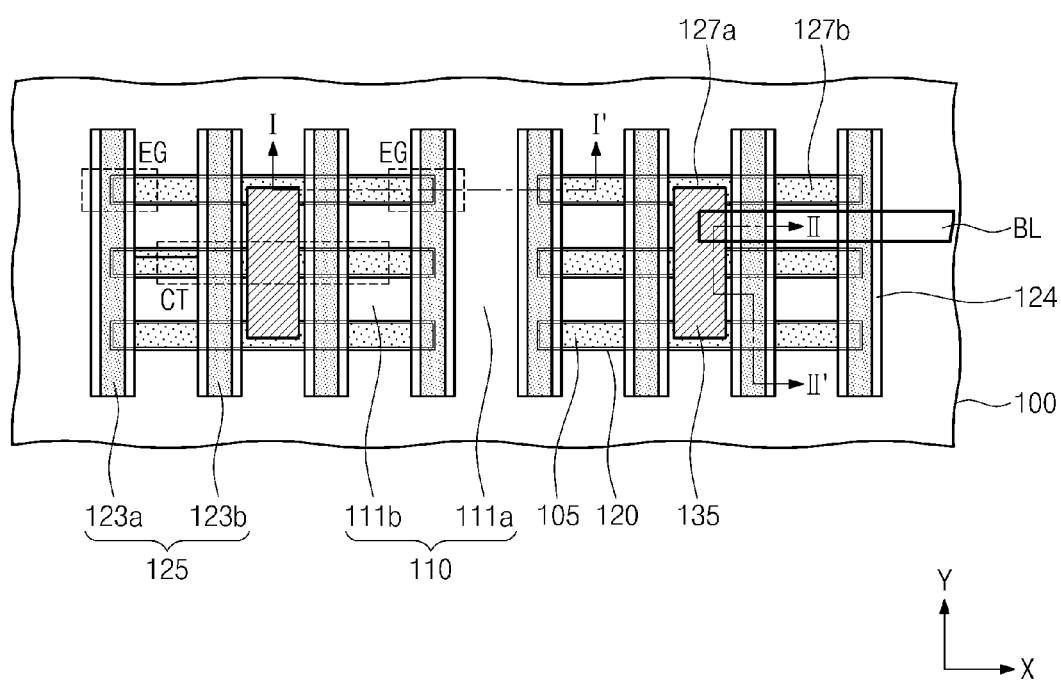
FIG. 2B is an exemplary plan view illustrating the semiconductor device of FIG. 2A.
Figure 2C:
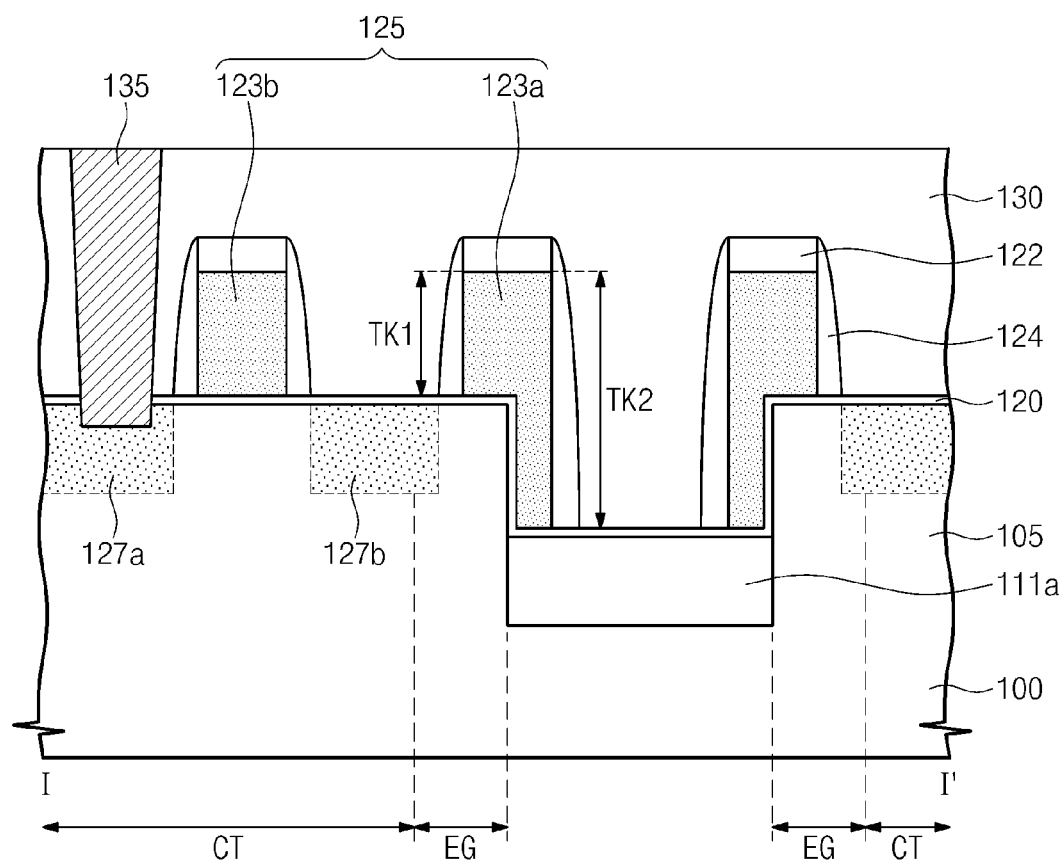
FIGS. 2C and 2D are exemplary cross-sectional views taken along lines I-I' and II-II' of FIG. 2B, respectively.
Figure 2D:
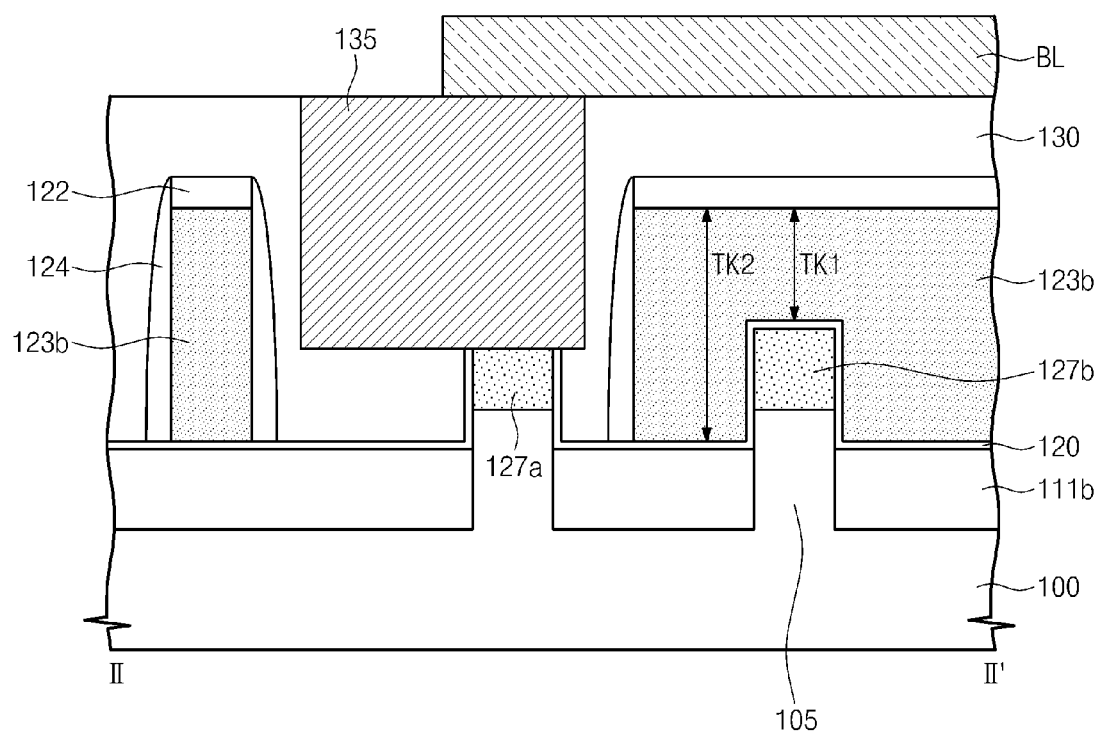
Figure 2E:
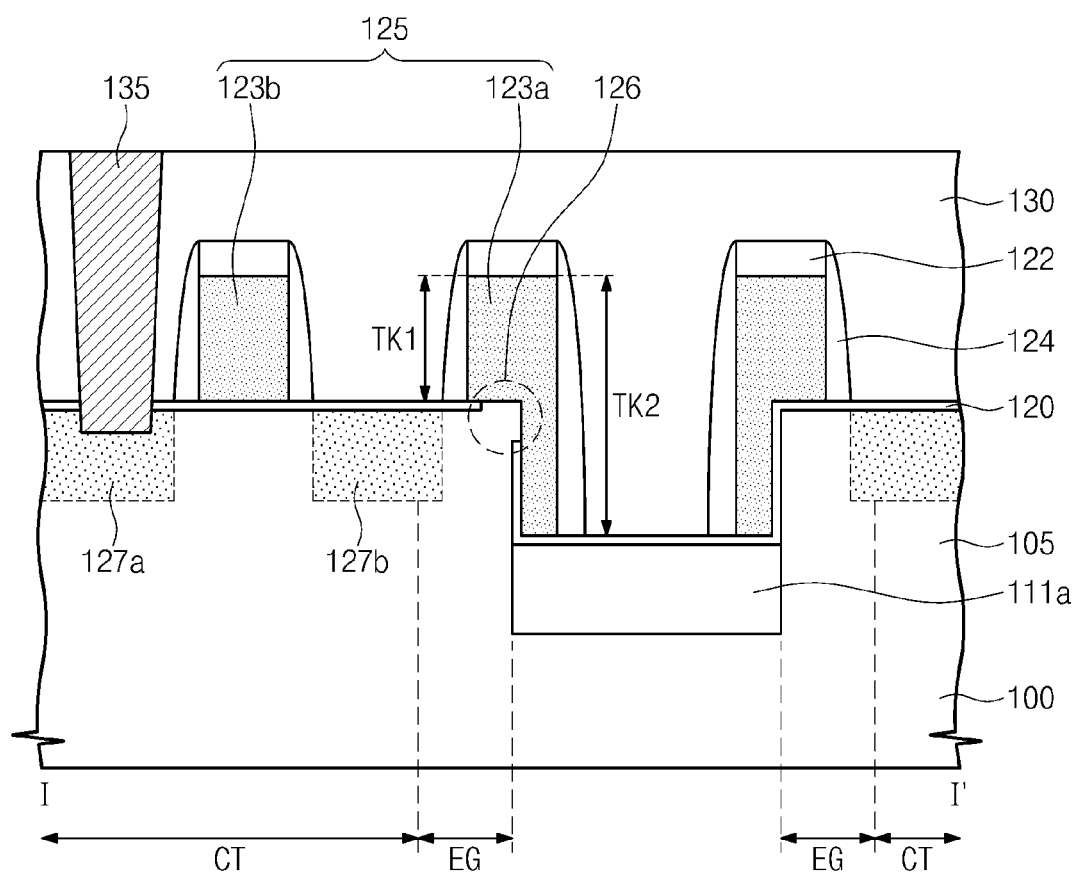
FIG. 2E is an exemplary cross-sectional view illustrating the semiconductor device of FIG. 2A after an insulation thin layer breakdown.

FIG. 2A is a perspective view illustrating a semiconductor device according to some embodiments of the inventive concepts, and FIG. 2B is an exemplary plan view illustrating the semiconductor device of FIG. 2A. FIGS. 2C and 2D are exemplary cross-sectional views taken along lines I-I' and II-II' of FIG. 2B, respectively. FIG. 2E is an exemplary cross-sectional view illustrating the semiconductor device of FIG. 2A after an insulation thin layer breakdown.

In the present embodiment, a semiconductor device including a fin-type one-time programmable (OTP) anti-fuse element will be described as an example.

Referring to FIGS. 2A through 2E, the semiconductor device may include fin-type active patterns 105 and conductive structures on a substrate 100.

The substrate 100 may include silicon, germanium, or silicon-germanium or may be a silicon-on-insulator (SOI) substrate.

The fin-type active patterns 105, also referred to herein as protruding active portions or protruding active regions, may extend in a first direction on the substrate 100. For example, the first direction may be an x-axis direction. As illustrated in FIG. 2B, the fin-type active patterns 105 may constitute a plurality of columns parallel to a second direction perpendicular to the first direction when viewed from a plan view. The fin-type active patterns 105 in one column may be spaced apart from the fin-type active patterns 105 constituting another column adjacent to the one column in the first direction. The fin-type active patterns 105 in each column may be spaced apart from each other in the second direction. The fin-type active patterns 105 may be two-dimensionally arranged in the first and second directions when viewed from a plan view. The fin-type active patterns 105 may have bar-shapes extending in the first direction when viewed from a plan view. Each of the fin-type active patterns 105 may protrude from the substrate 100 in a third direction. For example, the third direction may be a z-axis direction. Though the fin-type active patterns 105 are shown as being arranged horizontally, according to the orientation of FIG. 2B, they may be referred to as being arranged in columns. Thus, in certain embodiments as exemplified in the figures, the reference to rows and columns is merely relative to other elements shown.

According to some embodiments of the inventive concepts, the fin-type active pattern 105 may include an edge portion EG and a center portion CT, as illustrated in FIG. 2C. The edge portion EG of one fin-type active pattern 105 is adjacent to another fin-type active pattern 105 adjacent to the one fin-type active pattern 105 in the first direction. The center portion CT of the fin-type active pattern 105 is disposed between both edge portions EG of the fin-type active pattern 105. The edge portion EG may also be referred to herein as an end portion or an end region, for example having a terminal end, and the center portion CT may be referred to herein as a mid-section of the fin-type active pattern 105. As such, each fin-type active pattern 105 may have two opposite terminal ends located at opposite end portions, and may have a center portion extending between the two opposite end portions. Each terminal end may extend from a terminal edge of the fin-type active pattern 105 toward the center portion CT of the fin-type active pattern 105.

In some embodiments, the fin-type active patterns 105 may be formed by etching a bulk substrate. In other embodiments, the fin-type active patterns 105 may be formed by performing a selective epitaxial growth (SEG) process on the substrate 100.

The fin-type active patterns 105 may be electrically insulated from each other, for example, by a device isolation layer 110. The device isolation layer 110 may be formed of an insulative material, and may include, for example, at least one of an oxide, a nitride, and an oxynitride.

The device isolation layer 110 may be disposed between the fin-type active patterns 105 to expose sidewalls of upper portions of the fin-type active patterns 105. For example, in one embodiment, the device isolation layer 110 covers sidewalls of lower portions of fin-type active patterns 105, and does not cover sidewalls of upper portions of fin-type active patterns 105. As a result, a top surface of the device isolation layer 110 may be lower than top surfaces of the fin-type active patterns 105.

The device isolation layer 110 may include a first device isolation region 111a disposed between the fin-type active patterns 105 spaced apart from each other in the first direction (e.g., between terminal ends of two adjacent fin-type active patterns 105), and a second device isolation region 111b disposed between the fin-type active patterns 105 spaced apart from each other in the second direction (e.g., between sidewalls of two adjacent fin-type active patterns 105).

The conductive structure may include an insulating thin layer 120 and a conductive line pattern 125. The conductive line pattern 125 may extend to cross over the fin-type active patterns 105. For example, the conductive line pattern 125 may extend in the second direction perpendicular to the first direction. For example, the second direction may be a y-axis direction. The conductive line pattern 125 may include, for example, poly-silicon. The conductive line pattern 125 may include a plurality of conductive lines, for example, that are parallel to each other. Further, there may be a plurality of conductive line patterns—for example, as shown in FIG. 2B, one conductive line pattern may include the four conductive lines on the right, and another conductive line pattern may include the four conductive lines on the left. Thus, these eight conductive lines may be referred to as a conductive line pattern, or as two different conductive line patterns (e.g., one including four lines on the left and the other including four lines on the right). The term conductive line pattern as used herein may also refer to one conductive line (e.g., 123a or 123b), as each conductive line may be patterned in a patterning process. Note that the eight conductive lines shown in FIG. 2B are exemplary only, and other numbers of conductive lines and arrangements of them may be used.

The conductive line patterns 125 may include certain first conductive line patterns (e.g., 123a) crossing over the edge portions EG of the fin-type active patterns 105, and certain second conductive line patterns (e.g., 123b) crossing over the center portions CT of the fin-type active patterns 105. According to some embodiments of the inventive concepts, a portion of the first conductive line pattern 123a may cross over the edge portions EG of the fin-type active patterns 105, and another portion of the first conductive line pattern 123a may cross over the first and second device isolation regions 111a and 111b. The second conductive line pattern 123b may cross over the second device isolation regions 111b and the center portions CT of the fin-type active patterns 105 which are alternately arranged in the second direction. In certain embodiments, a top surface of the first conductive line pattern 123a may be disposed at a substantially same level as a top surface of the second conductive line pattern 123b.

Structures of the conductive line patterns 125 will be described in more detail hereinafter. The first conductive line pattern 123a may have a first thickness TK1 (also referred to as height) on the edge portion EG of the fin-type active pattern 105 and may have a second thickness TK2 (also referred to as height) greater than the first thickness TK1 on the first and second device isolation regions 111a and 111b. Due to this thickness difference, the first conductive line pattern 123a may have a step difference between the edge portion EG of the fin-type active pattern 105 and the first device isolation region 111a and a step difference between the edge portion of the fin-type active pattern 105 and the second device isolation region 111b. Additionally, the second conductive line pattern 123b may have the first thickness TK1 on the center portion CT of the fin-type active pattern 105 and may have the second thickness TK2 on the second device isolation region 111b. Due to this thickness difference, the second conductive line pattern 123b may have a step difference between the center portion CT of the fin-type active pattern 105 and the second device isolation region 111b.

In some embodiments, the first conductive line pattern 123a may function as the gate electrode of the transistor structure TW for the write operation illustrated in FIG. 1A. As described above, the transistor structure TW may be an anti-fuse element. The second conductive line pattern 123b may function as the gate electrode of the transistor TR for the read operation illustrated in FIG. 1A.

The insulating thin layer 120 may be disposed between the conductive line patterns 125 and the fin-type active patterns 105. The insulating thin layer 120 may include, for example, an oxide (e.g., silicon oxide).

Generally, all conductive line patterns used as gate electrodes of a transistor for write operation and a transistor for read operation may cross over center portions of fin-type active patterns. However, in the present embodiment, a portion of the first conductive line pattern 123a crosses over the edge portions EG of the fin-type active patterns 105, and another portion of the first conductive line pattern 123a is disposed on the device isolation layer 110 adjacent to the edge portions EG. Thus, the first conductive line pattern 123a may cover an end sidewall parallel to the second direction of the edge portion EG as well as a top surface and both sidewalls parallel to the first direction of the edge portion EG. As a result, the first conductive line pattern 123a may cover vertex regions of the edge portion EG. Each vertex region of the edge portion EG may be a point region where three edges of the edge portion meet each other. These vertex regions may also be referred to as corner portions, or point corner portions. Note however, that the point corner portion may not converge to a sharp point as depicted in the figures, but may have a slightly rounded corner where the top surface, sidewall, and end sidewall meet.

Stated differently, a first conductive line 123a may be disposed on an edge portion of the fin-type active pattern 105 and on the device isolation layer 110 adjacent to the edge portion of the fin-type active pattern. The first conductive line 123a may continuously cover a top surface of the edge portion of the first fin-type active pattern 105, an end sidewall of the edge portion EG of the first fin-type active pattern 105, and a terminal edge between the top surface and the end sidewall. Further, the first conductive line may cover at least a first point corner portion of the fin-type active pattern 105 (e.g., it may cover two such point corner portions connected by the terminal edge).

An electric field generated in the write operation may be concentrated at the vertex region of the edge portion EG. Thus, the insulating thin layer 120 may be easily broken at the vertex region of the edge portion EG by joule heating during write operation. As such, the first conductive line 123a forms part of a breakdownable corner gate structure that may function as an anti-fuse, or corner gate structured anti-fuse. As shown in FIG. 2E, after a corner portion 126 of the insulating thin layer 120 breaks down, the first conductive line 123a may form an electrical connection to the substrate 100, and thus may function as a resistor. Additionally, an area of the broken region of the insulating thin layer 120 may be reduced. As a result, a voltage used for the write operation may be reduced. Due to the low voltage write operation, a size of a charge pump may be reduced, and interference (e.g., a parasitic capacitance) between adjacent cells may be reduced. For example, in certain embodiments, the size of the charge pump may be reduced by about 5% due to the low voltage write operation, so that an entire area of a chip may be reduced by about 5.5%.

Generally, a dummy pattern may be disposed at the position where the first conductive line pattern 123a according to the present embodiment is disposed. However, a general dummy pattern is not formed in the present embodiment. Rather, the first conductive line pattern 123a is part of an anti-fuse, which, after being broken down, may form a resistor. Accordingly, the first conductive line pattern 123a may function as an anti-fuse, whereby a write voltage is applied in order to program it. As a result of omitting extra dummy patterns, an area of a bit cell array of the semiconductor device may be reduced. Redundant bits may be further formed in an available space secured by the reduction of the bit cell array. For example, in certain embodiments, because the dummy pattern is not used, the area of the bit cell array may be reduced by about 33%, and a redundancy of about 33% may be further secured.

The conductive structure may further include dopant regions 127a and 127b formed in the fin-type active pattern 105 exposed at both sides of the conductive line pattern 125. Thus, the conductive structure may function as a transistor. In particular, the conductive structure may function as a transistor having a three-dimensional channel region by the fin-type active patterns 105 in the present embodiment.

In some embodiments, the conductive structure may further include a mask pattern 122 disposed on the conductive line pattern 125, and spacers 124 disposed on both sidewalls of the conductive line pattern 125 and the mask pattern 122. The mask pattern 122 and the spacers 124 may extend in the second direction. The mask pattern 122 and the spacers 124 may include, for example, at least one of a nitride (e.g., silicon nitride) and an oxynitride (e.g., silicon oxynitride).

The semiconductor device may further include a bit line contact plug 135 electrically connecting a bit line BL to the dopant regions 127a. One cell including four conductive structures is described as an example in the present embodiment. The four conductive structures may be spaced apart from each other in the first direction. The first conductive line patterns 123a of two conductive structures may cross over both edge portions EG of the fin-type active patterns 105. The second conductive line patterns 123b of two conductive structures may cross over the center portions of the fin-type active patterns 105. The bit line contact plug 135 may be disposed between two second conductive line patterns 123b crossing over the center portions CT of the fin-type active patterns 105. The bit line contact plug 135 may be electrically connected to the dopant regions 127a which are spaced apart from each other between the two second conductive line patterns 123b adjacent to each other. In certain embodiments, the two conductive structures adjacent to the bit line contact plug 135 may function as the transistors TR for the read operation illustrated in FIG. 1A.

The bit line BL may be electrically connected to the dopant regions 127a through the bit line contact plug 135. The bit line BL may extend, for example, in the first direction.

Figure 3A:
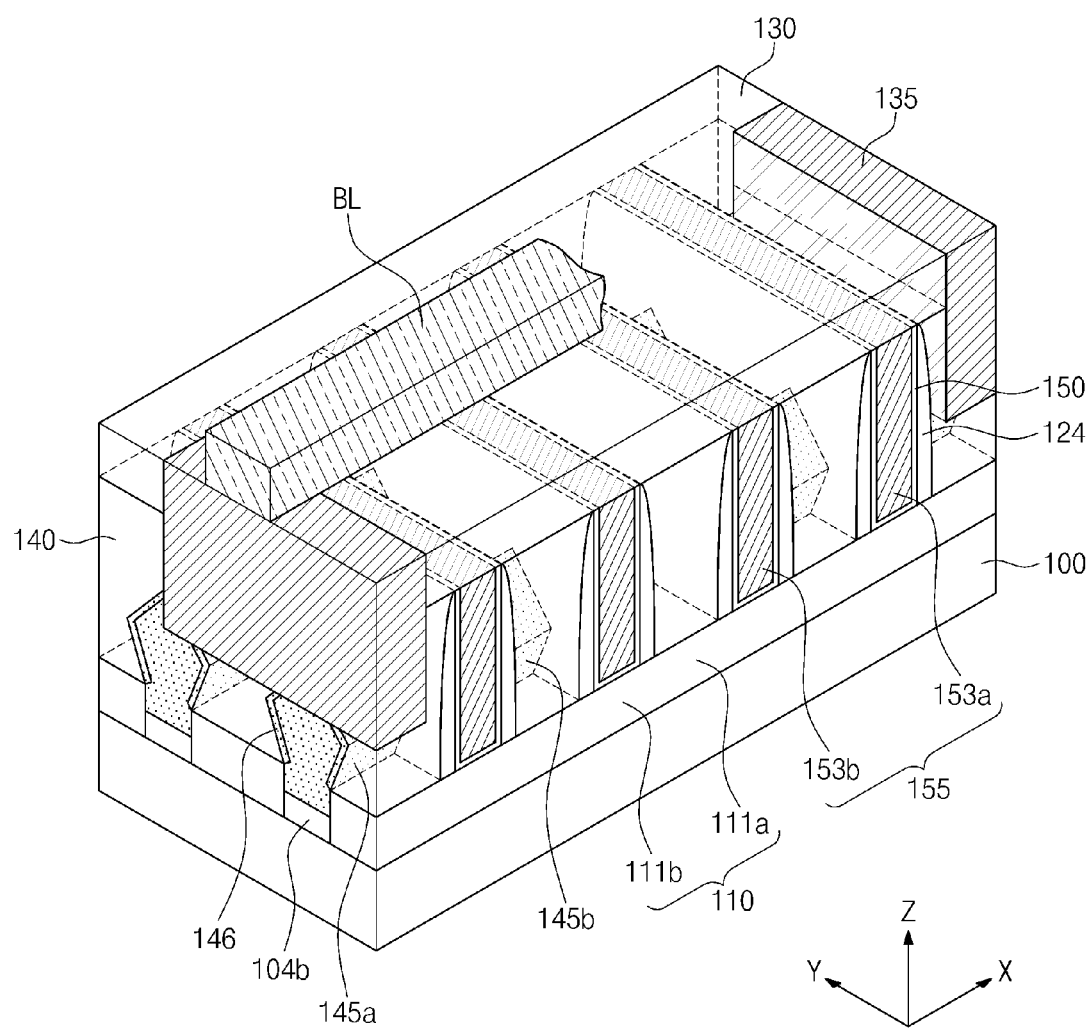
FIG. 3A is a perspective view illustrating a semiconductor device according to other embodiments of the inventive concepts.
Figure 3B:
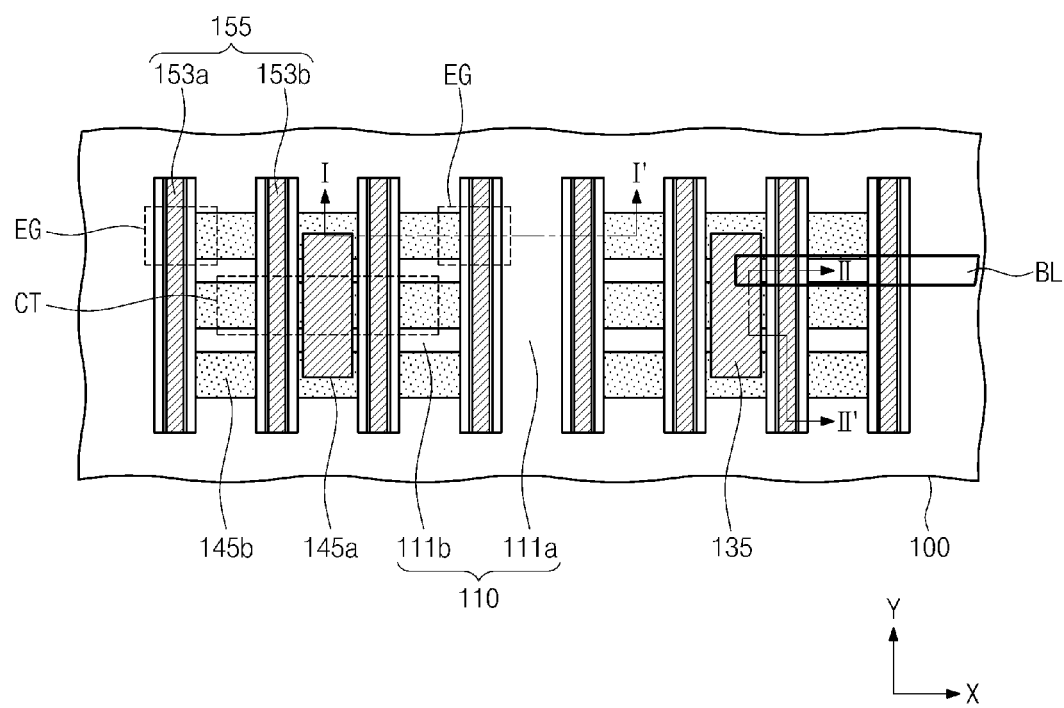
FIG. 3B is an exemplary plan view illustrating the semiconductor device of FIG. 3A.
Figure 3C:
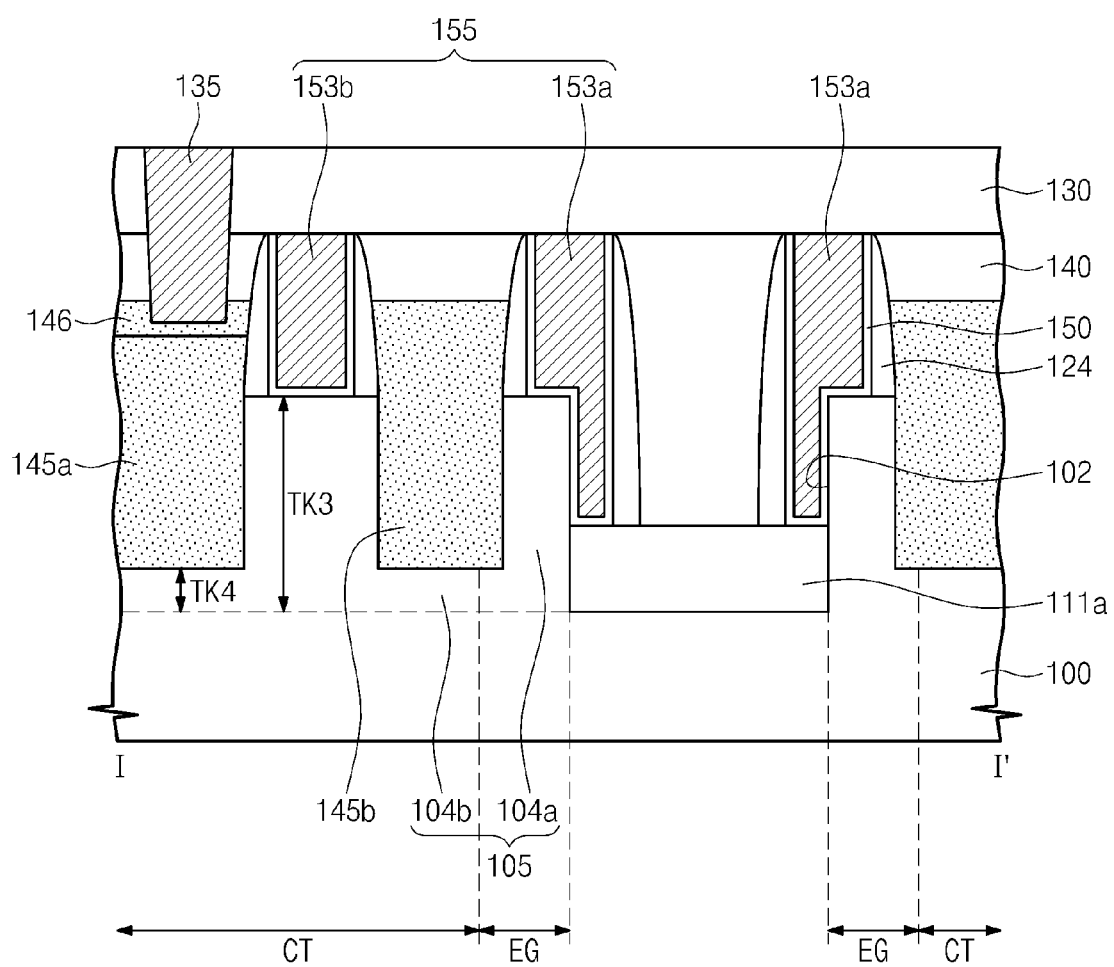
FIGS. 3C and 3D are exemplary cross-sectional views taken along lines I-I' and II-II' of FIG. 3B, respectively.
Figure 3D:
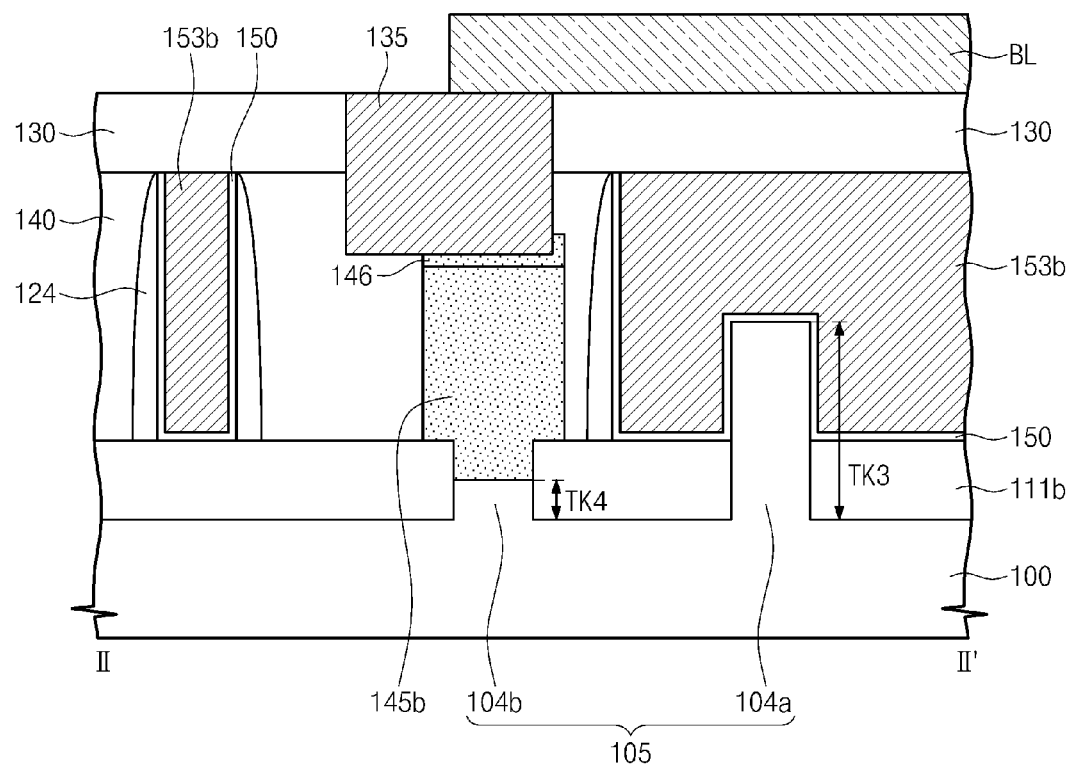
Figure 4A:
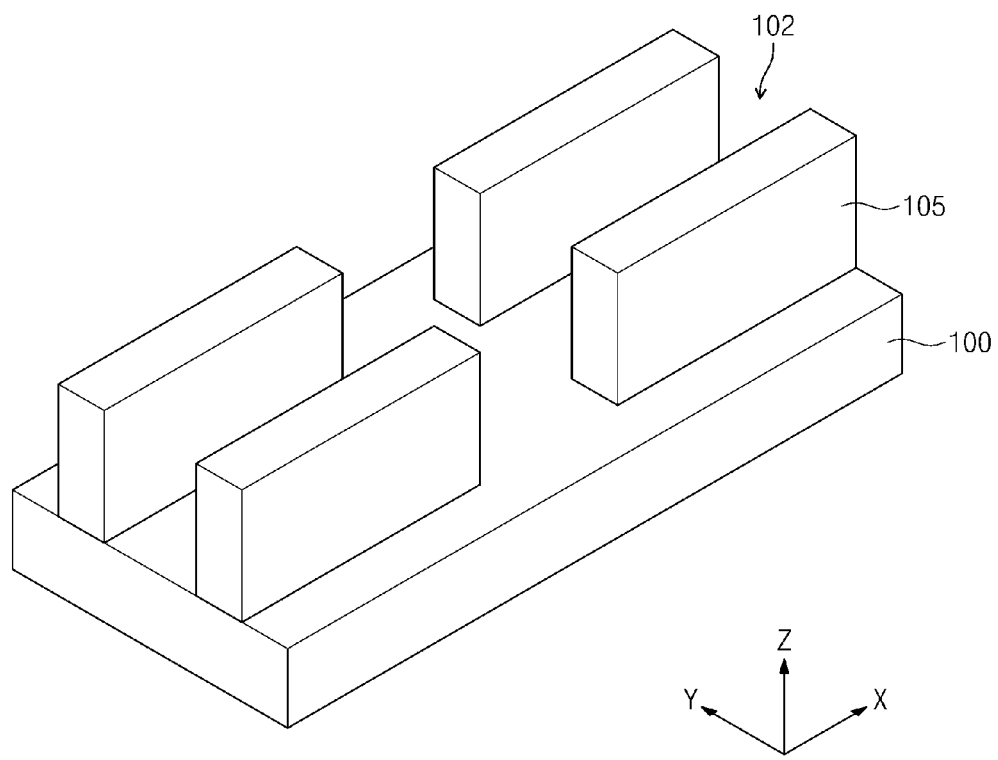
Figure 4B:
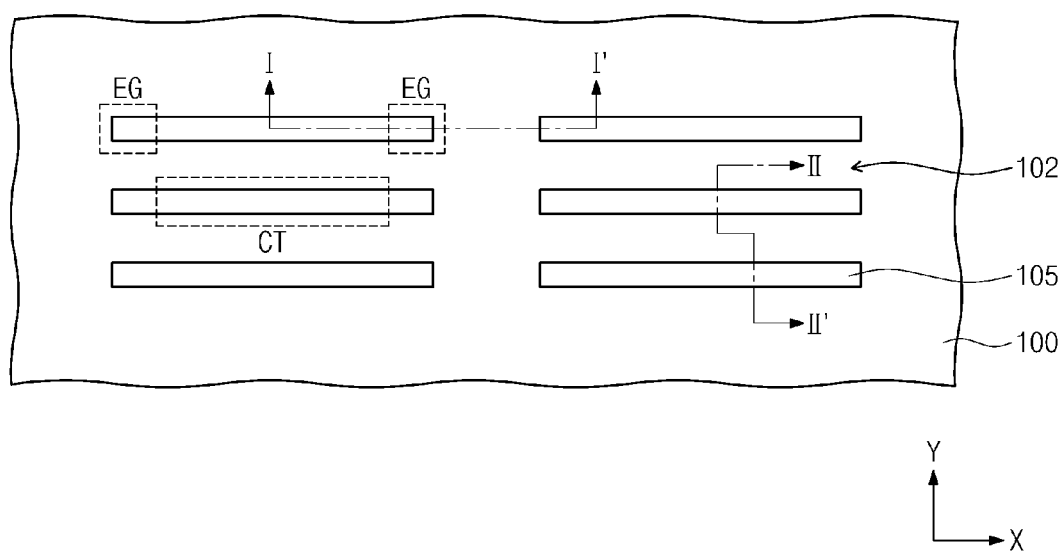
Figure 4C:
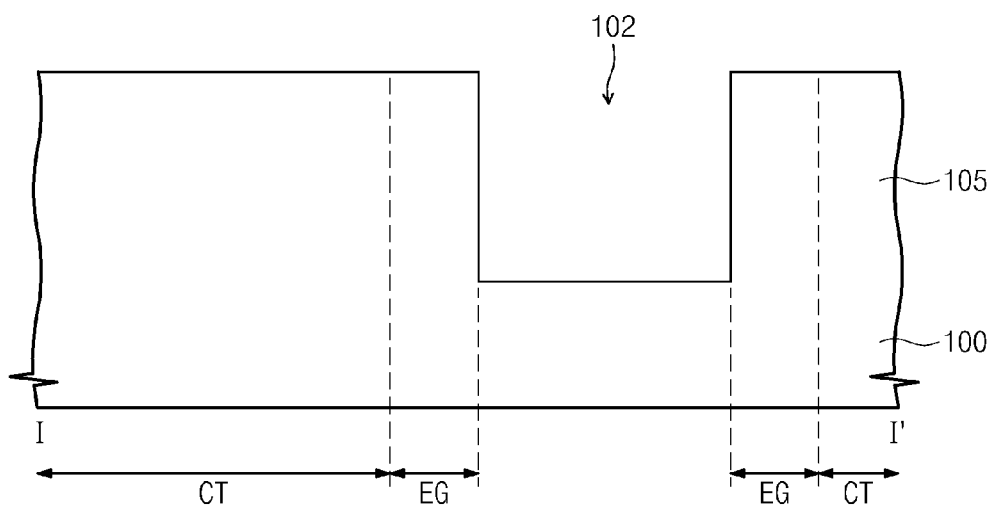
Figure 4D:
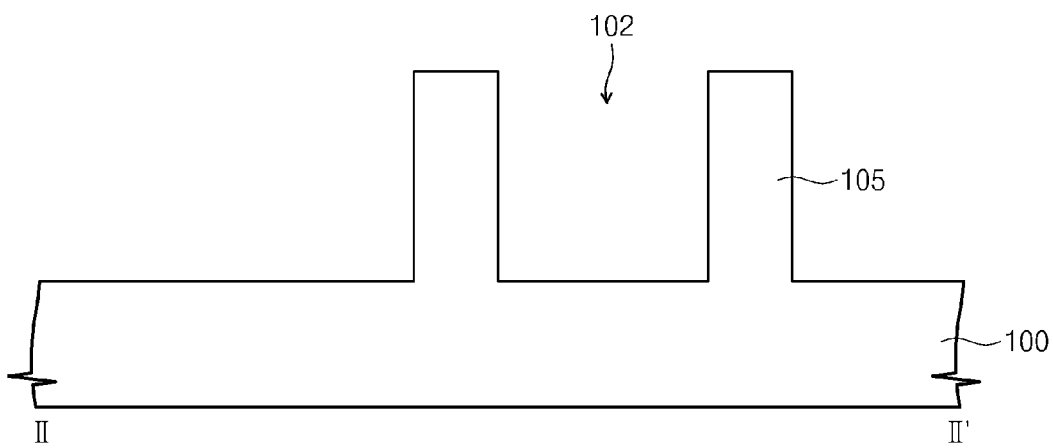
Figure 5A:
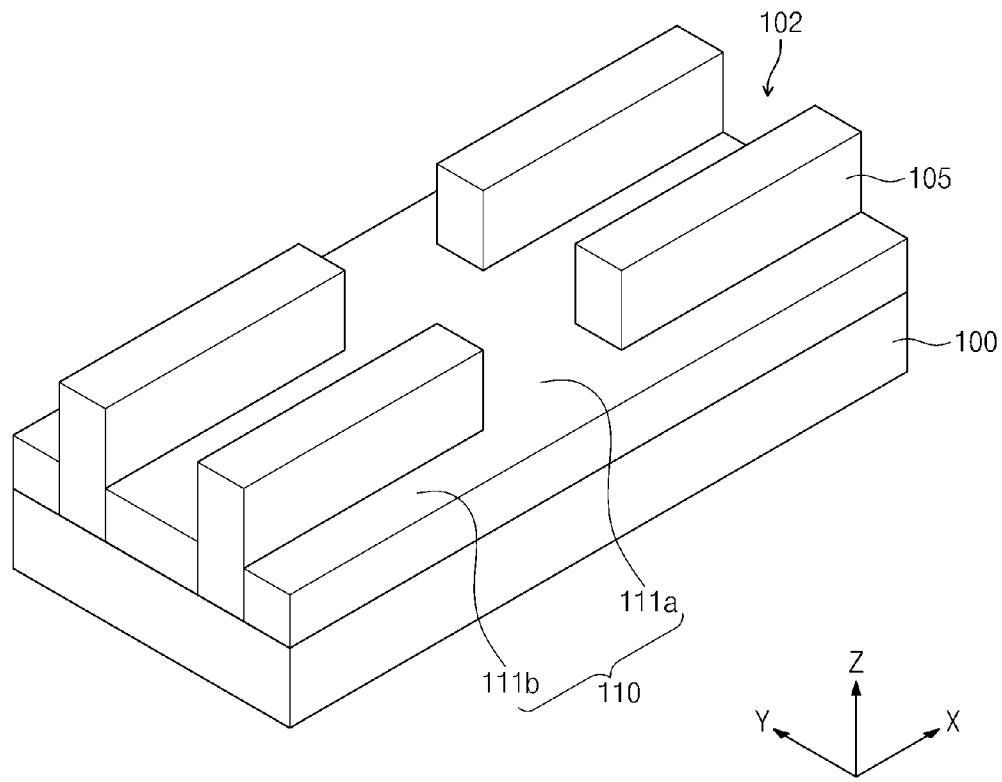
Figure 5B:
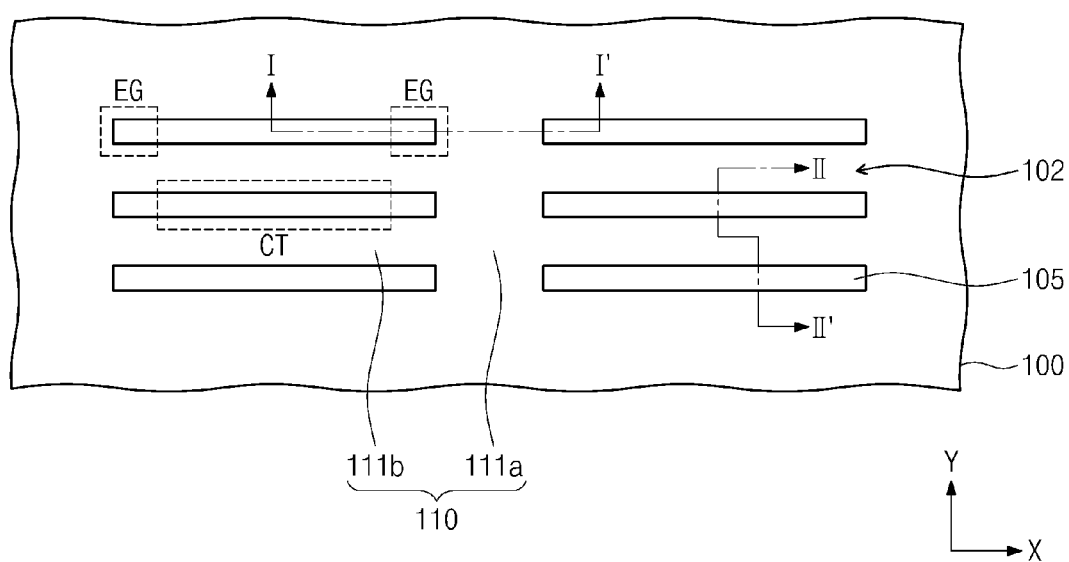
Figure 5C:
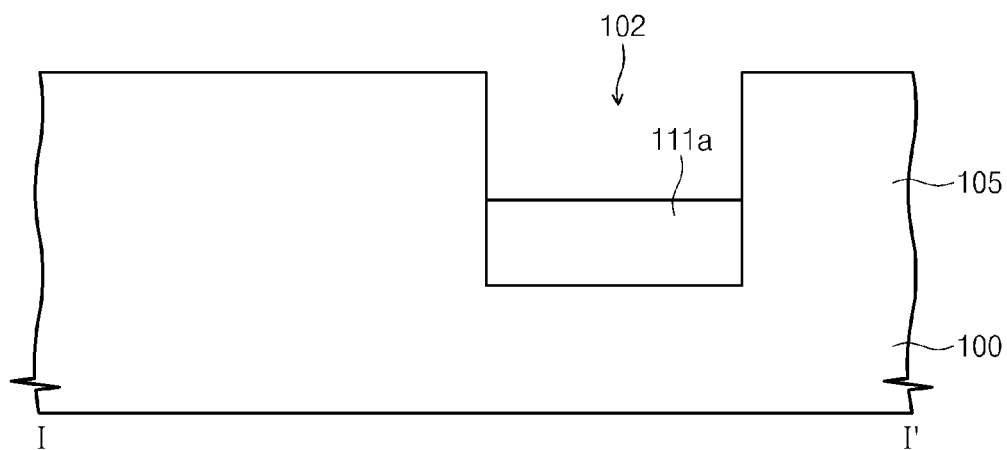
Figure 5D:
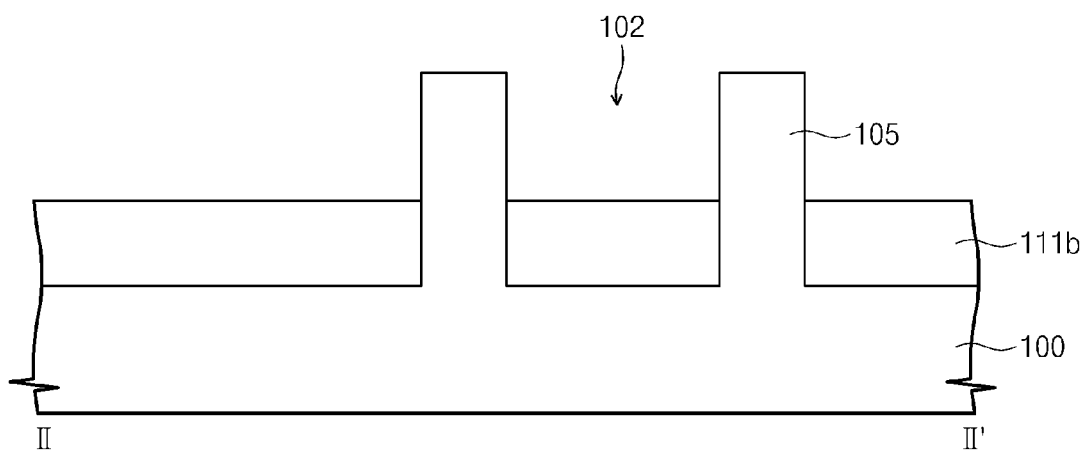
Figure 6A:
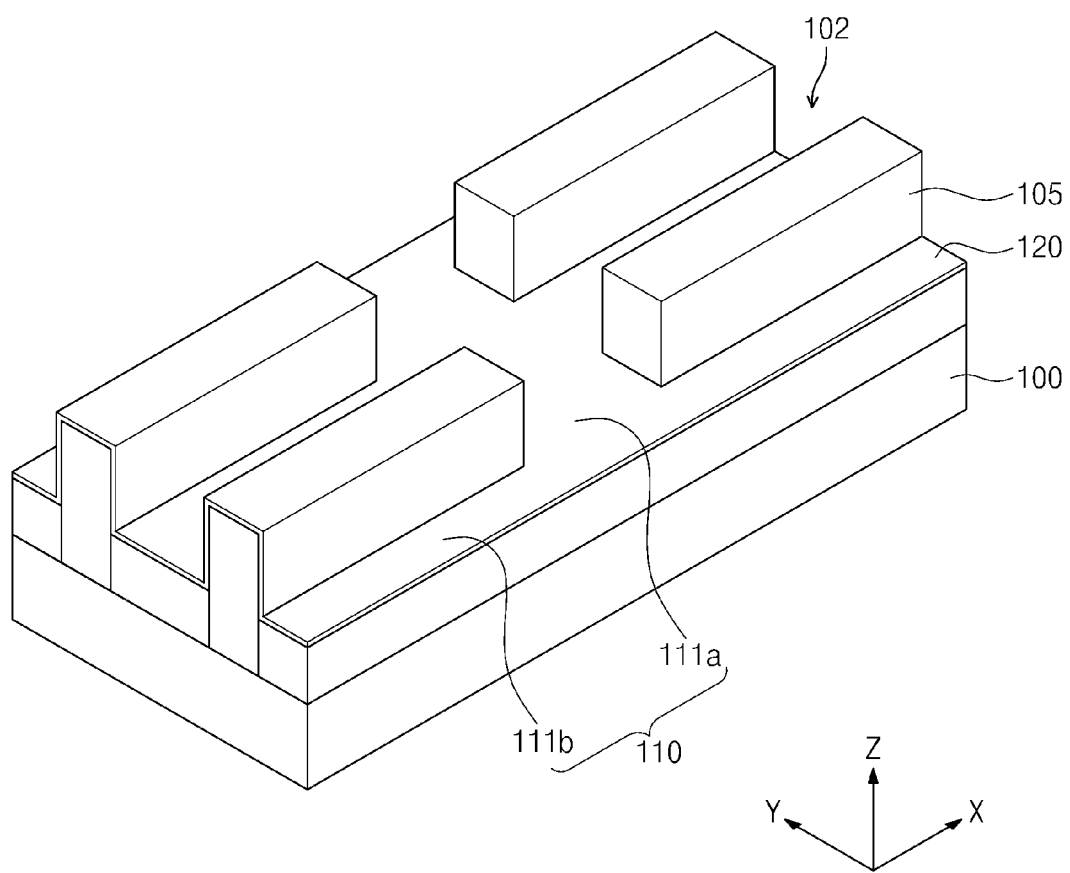
Figure 6B:
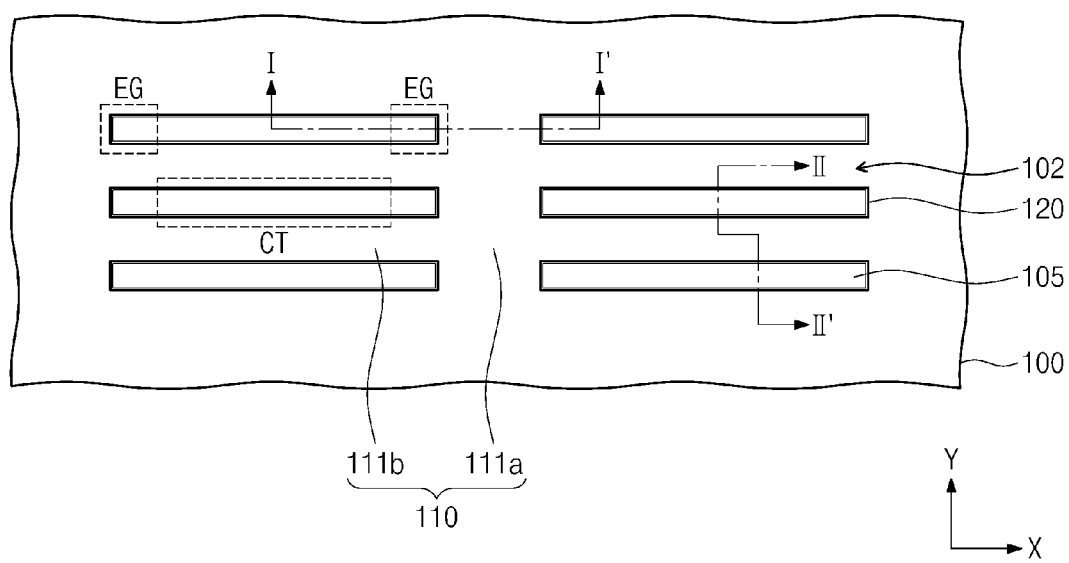
Figure 6C:
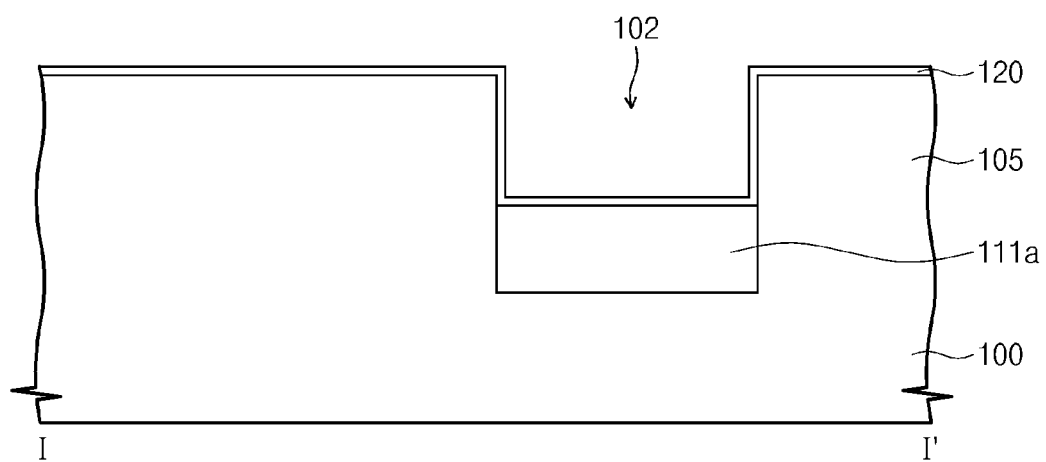
Figure 6D:
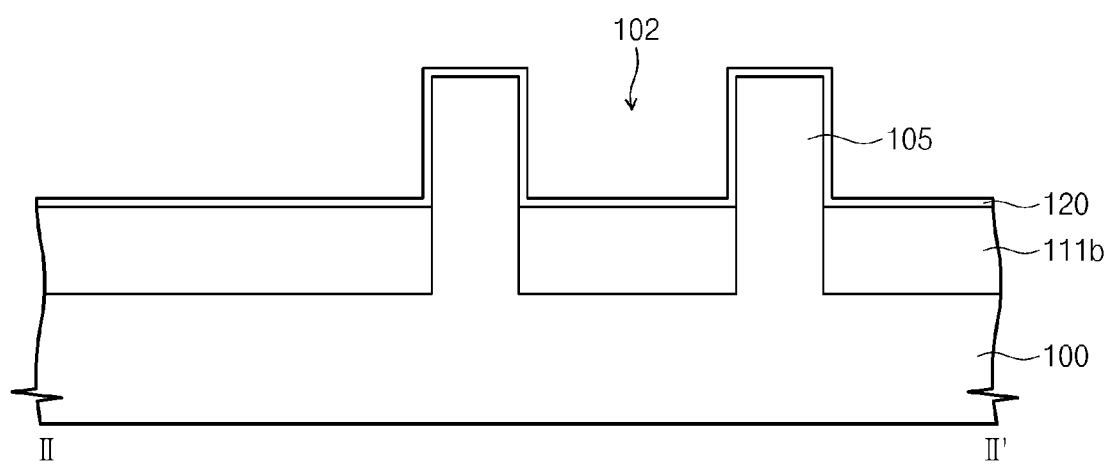
Figure 7A:
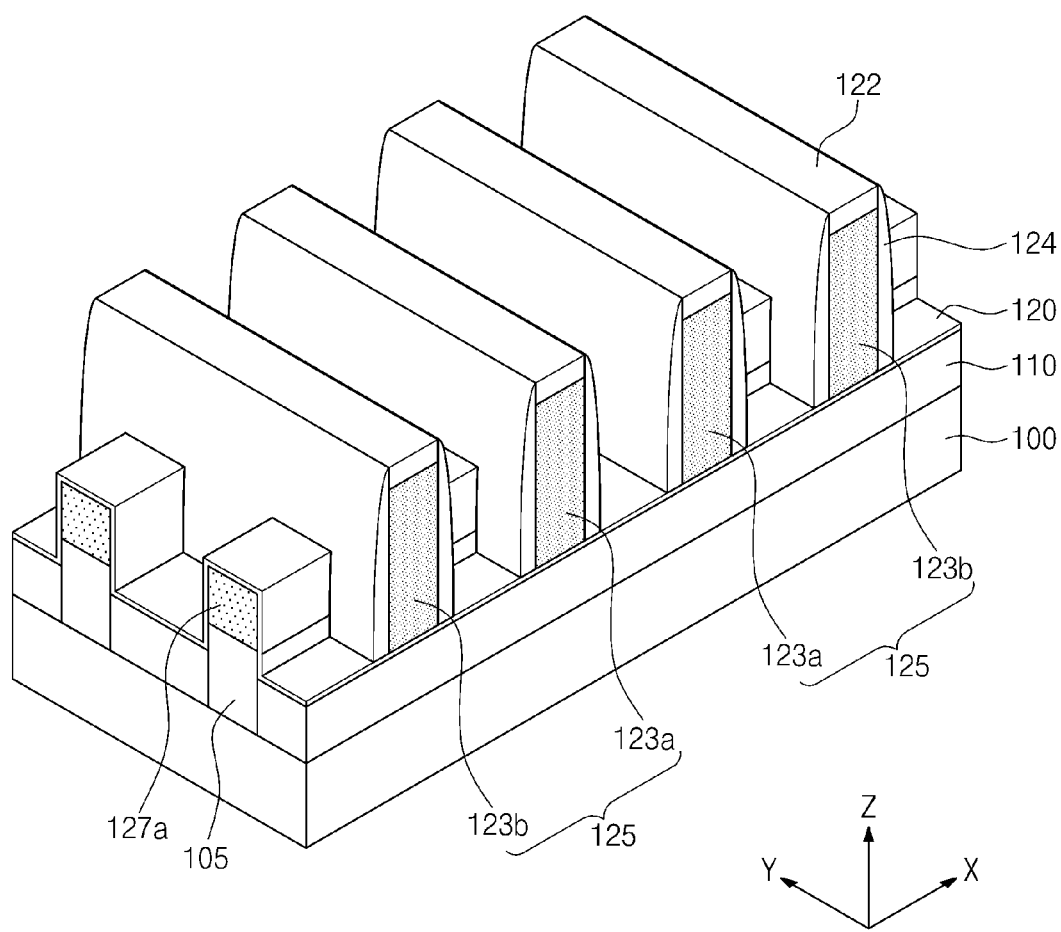
Figure 7B:
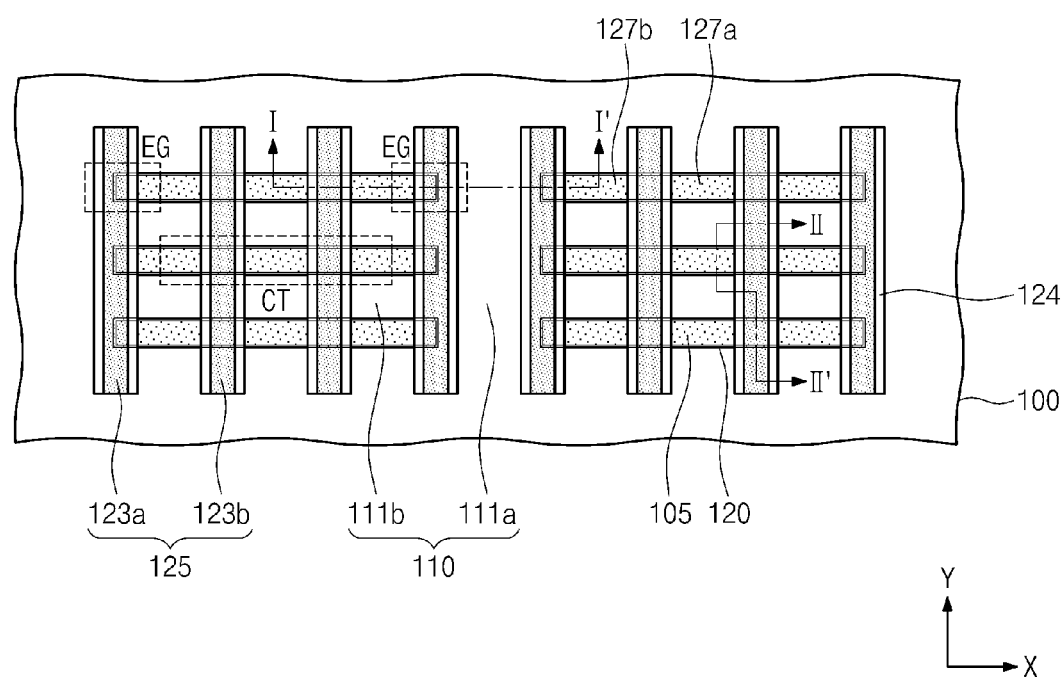
Figure 7C:
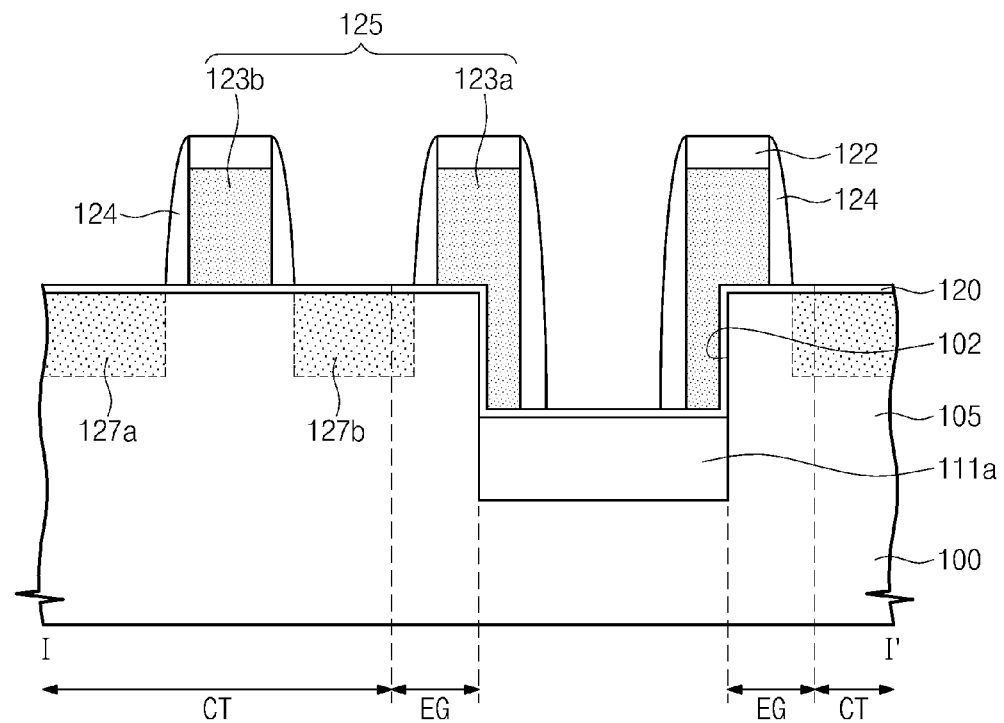
Figure 7D:
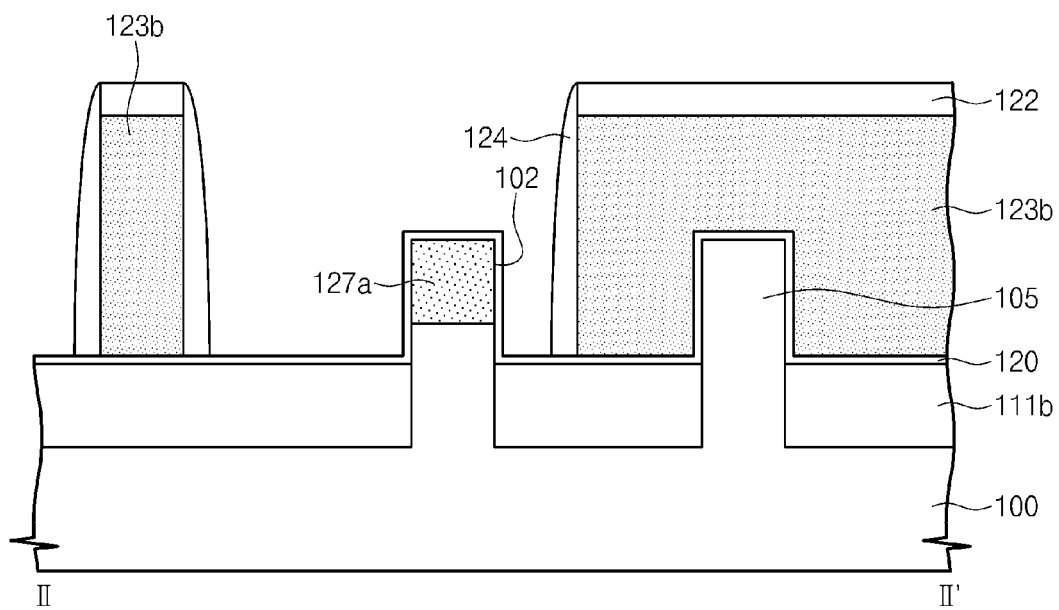
Figure 8A:
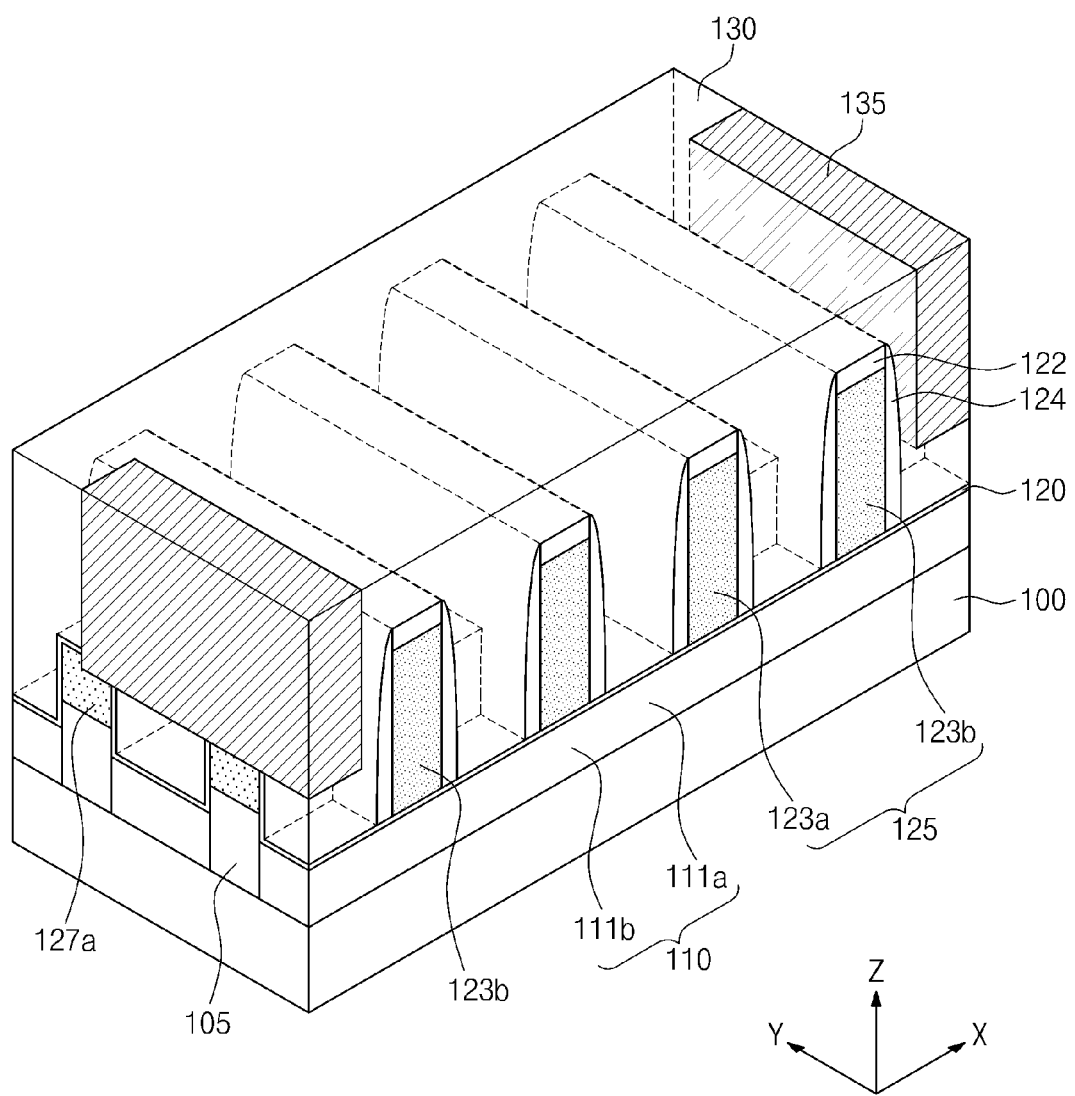
Figure 8B:
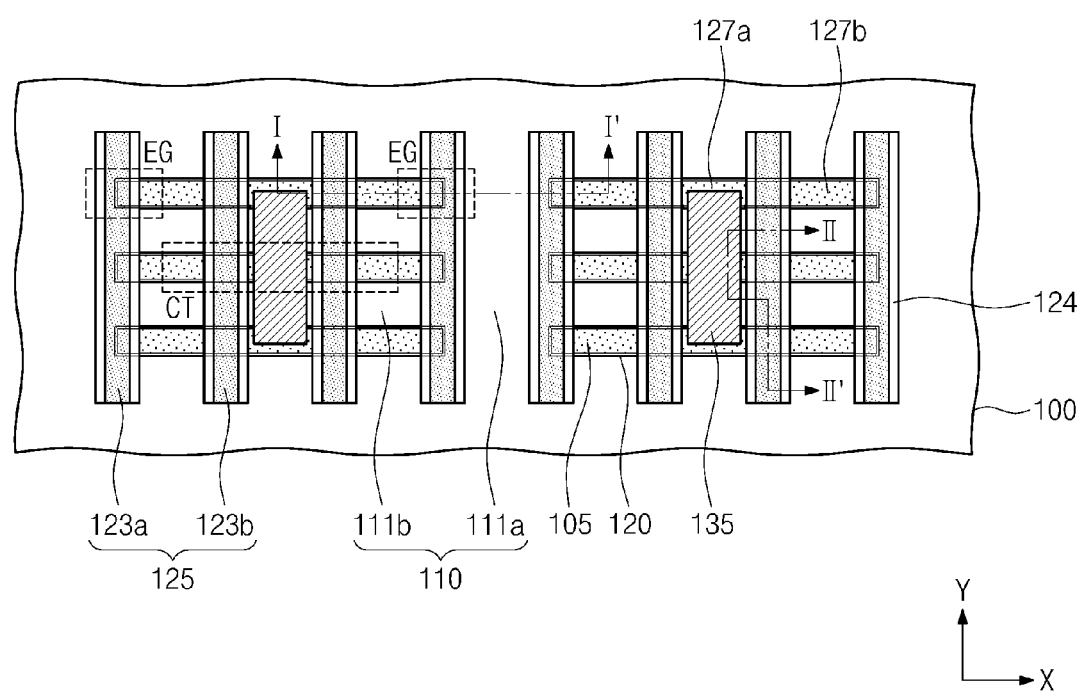
Figure 8C:
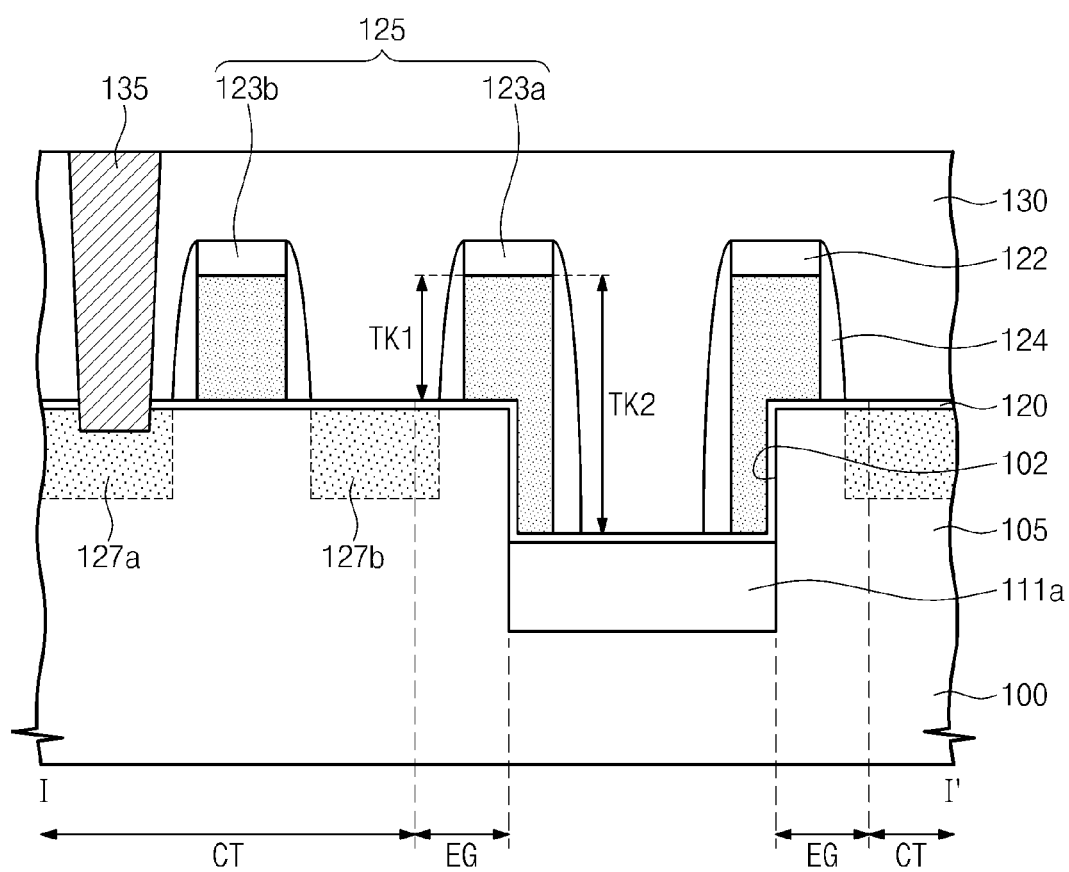
Figure 8D:
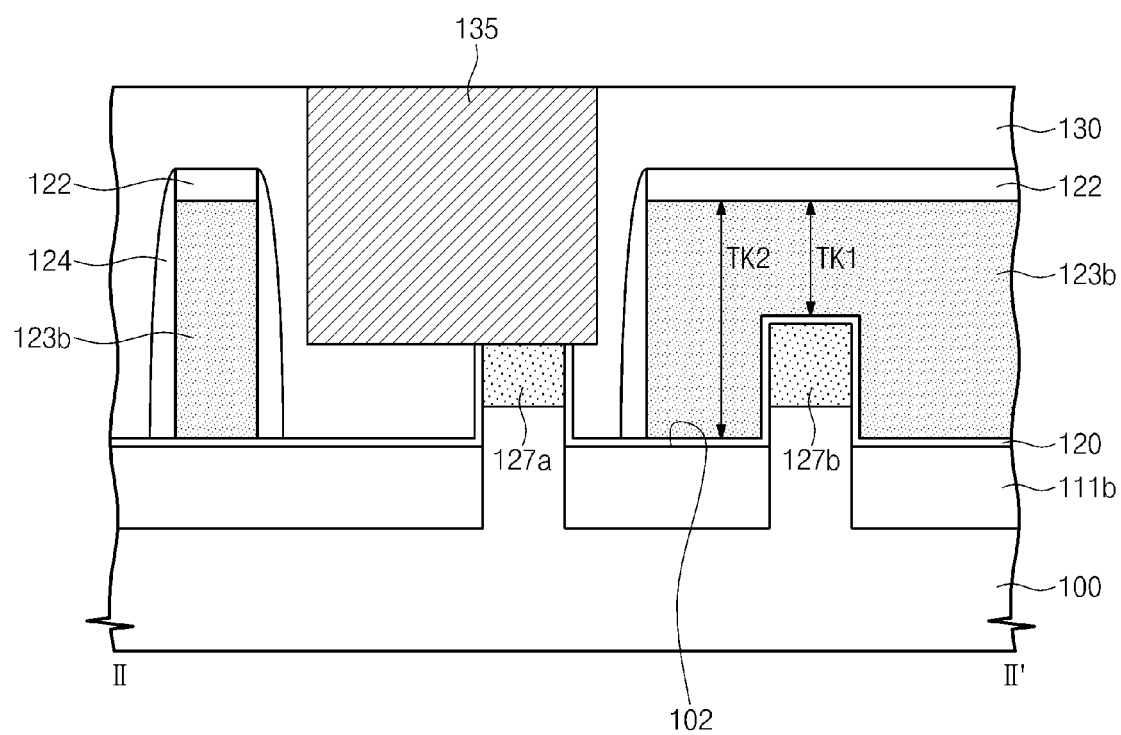
Figure 9A:
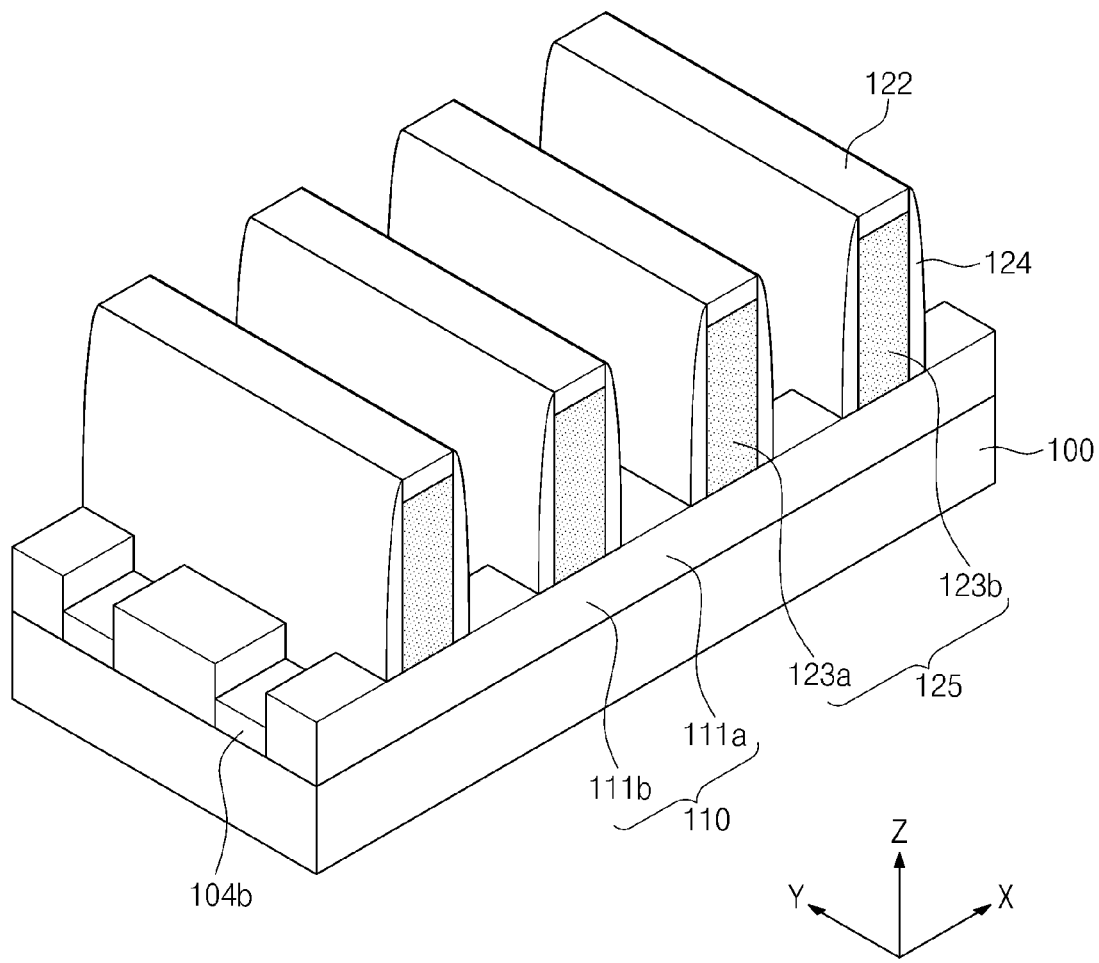
Figure 9B:
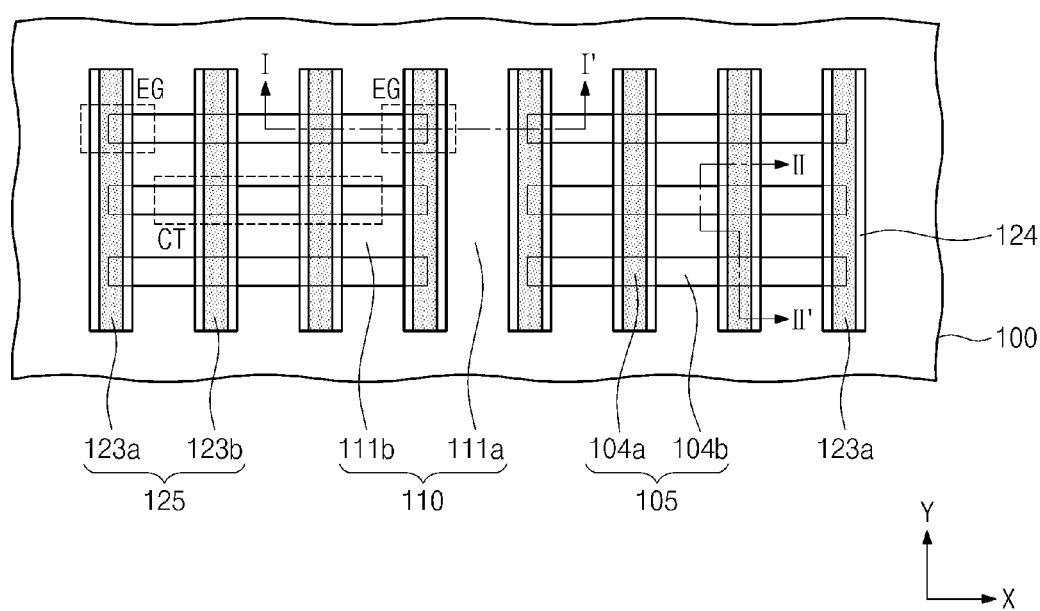
Figure 9C:
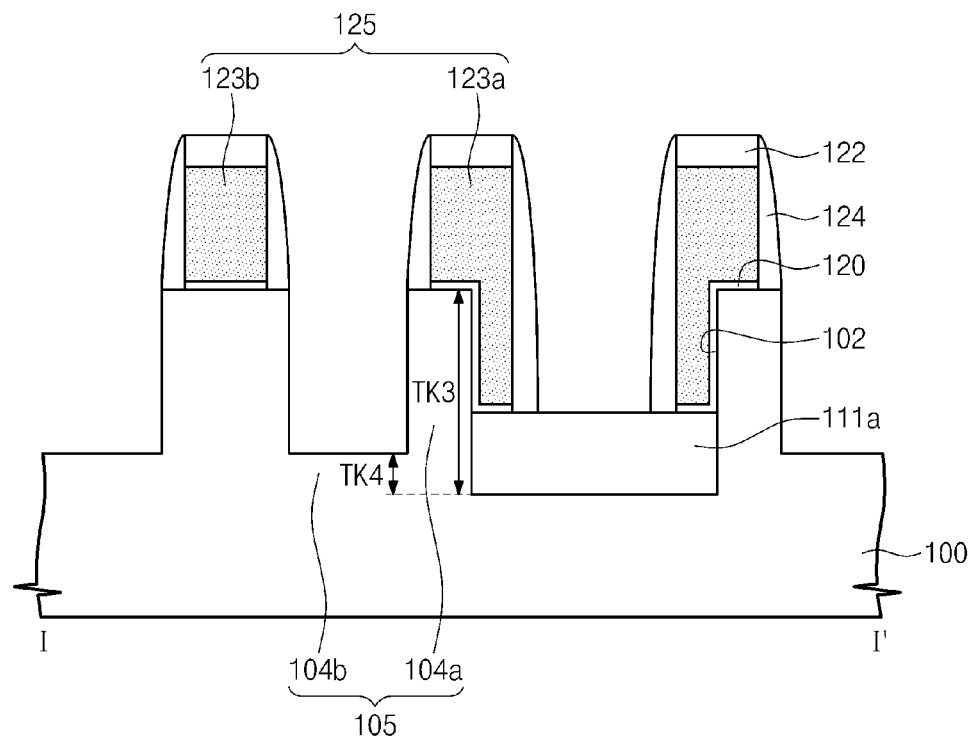
Figure 9D:
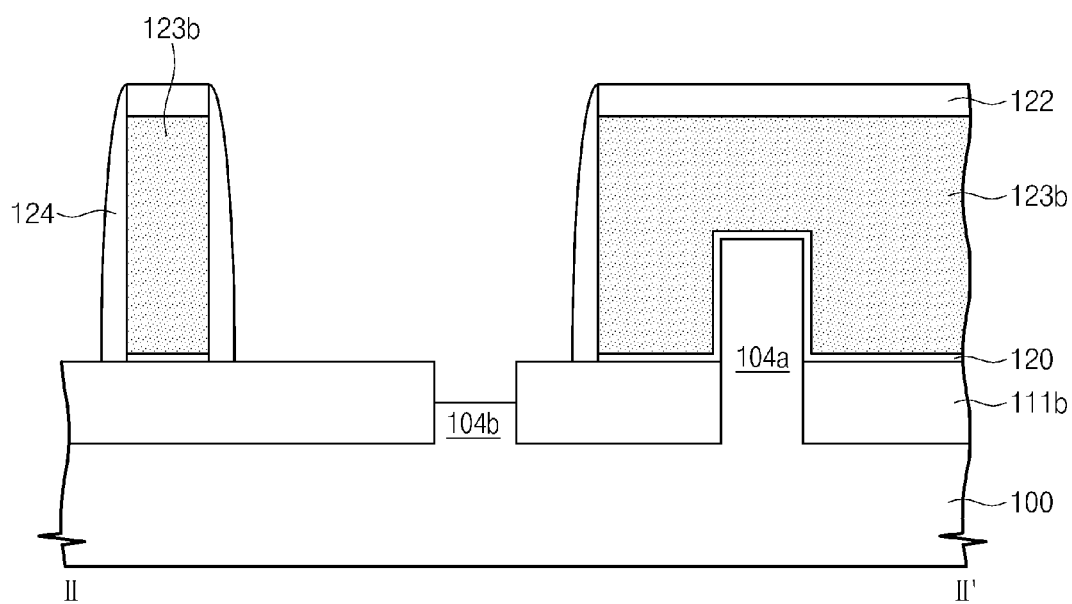
Figure 10A:
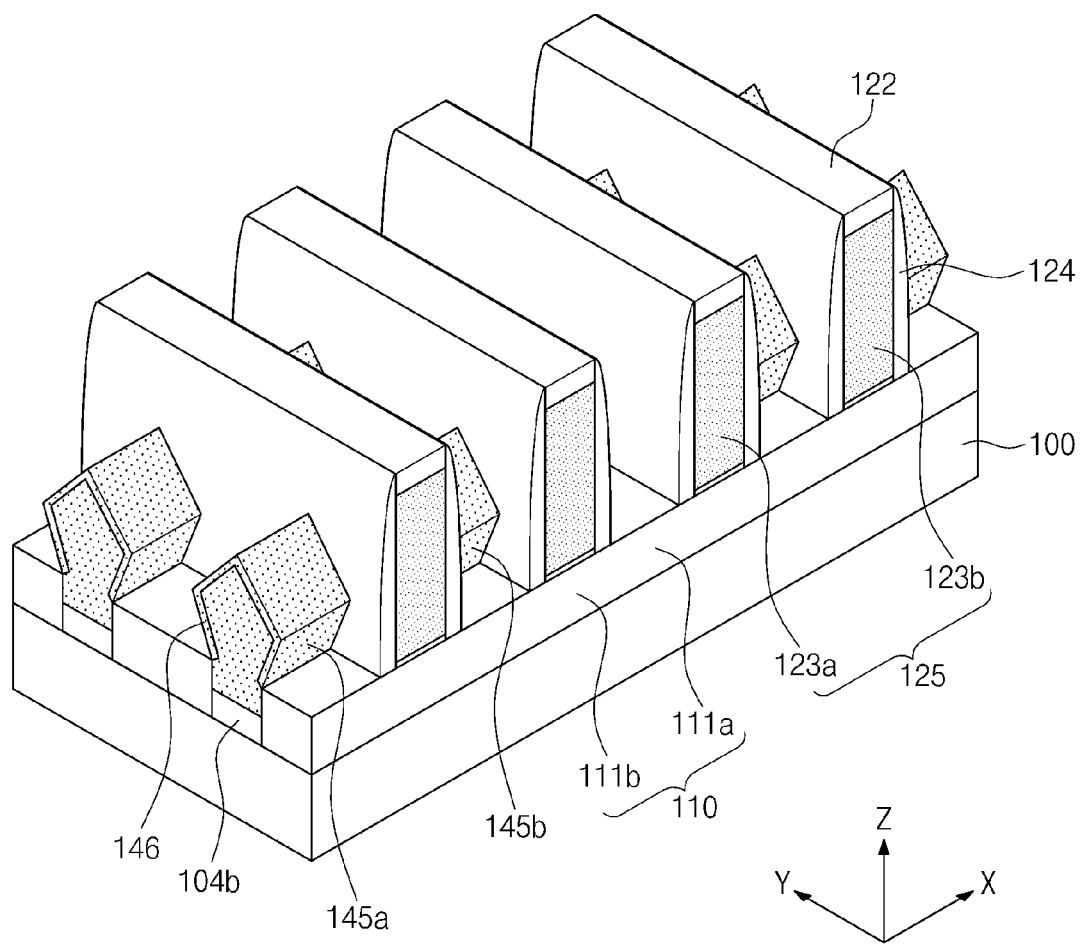
Figure 10B:
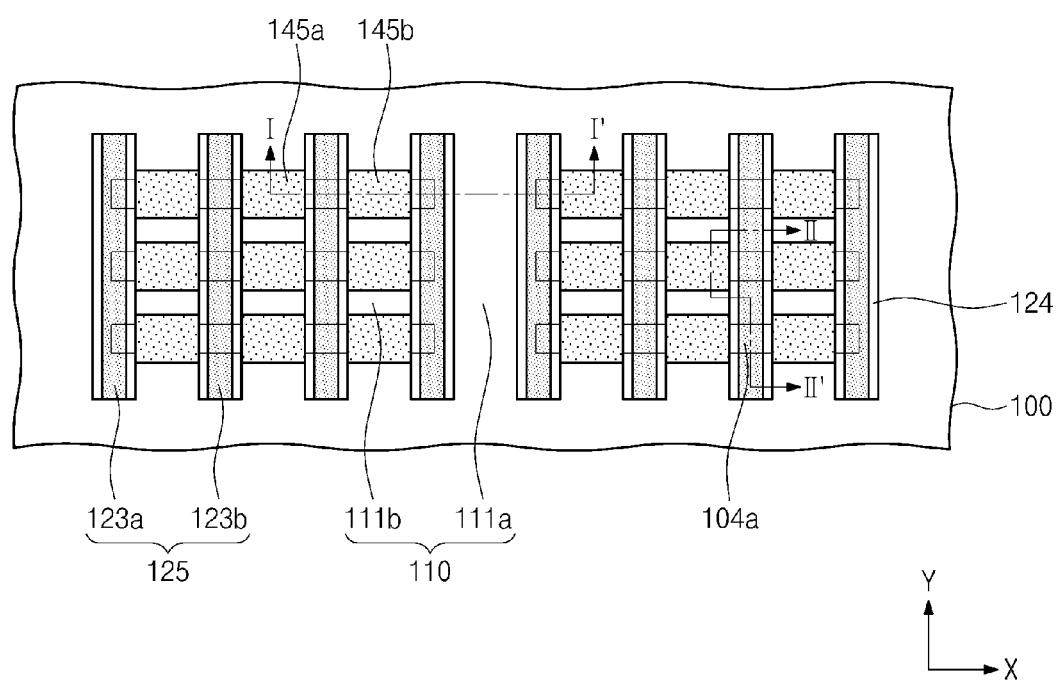
Figure 10C:
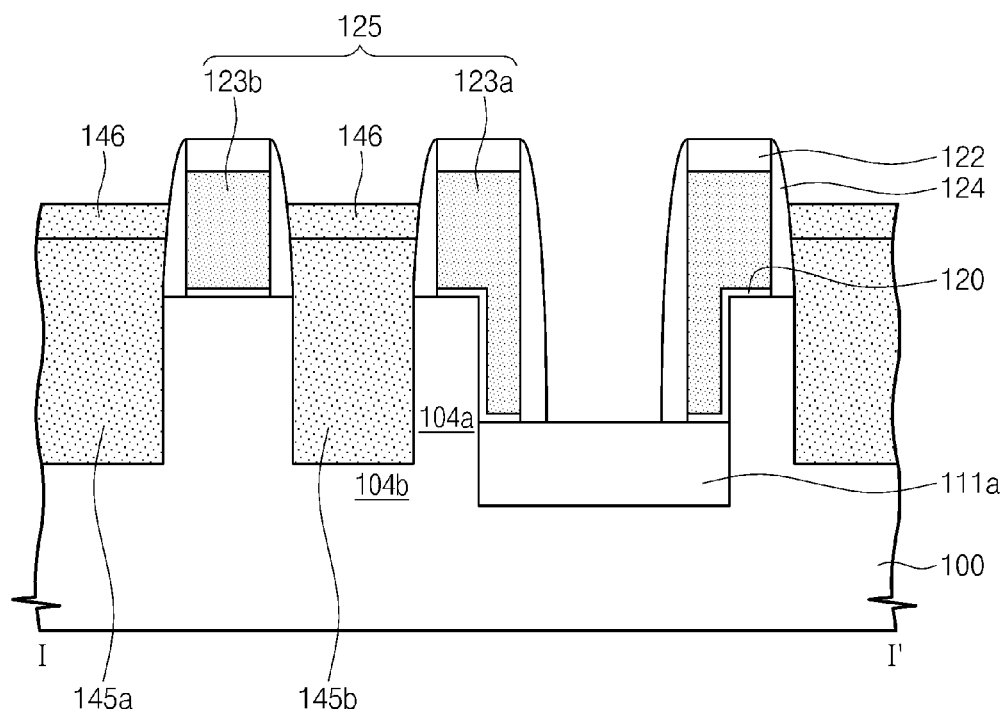
Figure 10D:
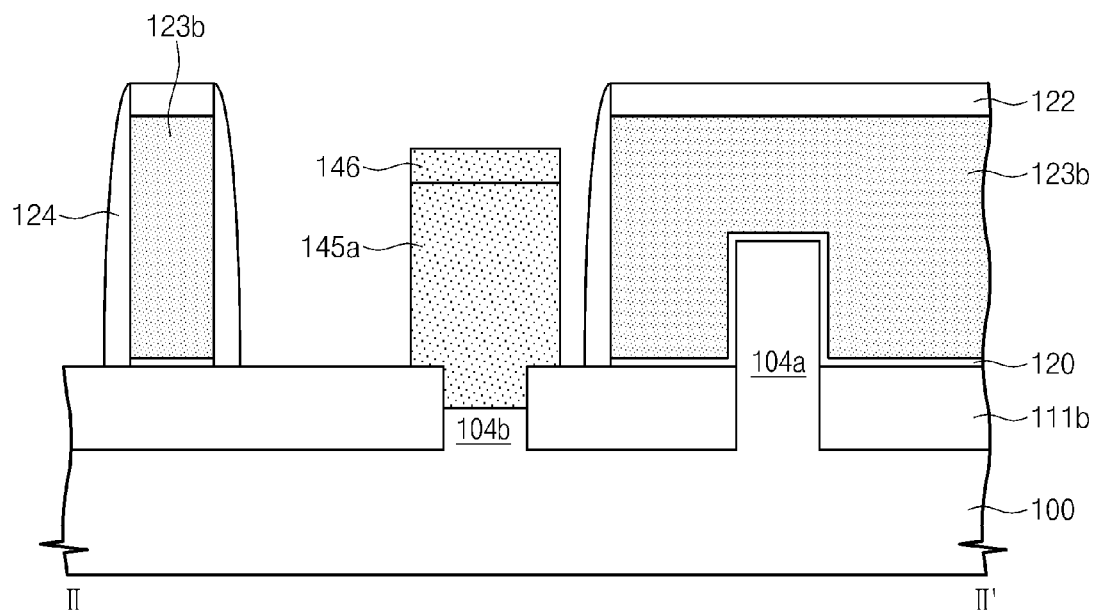
Figure 11A:
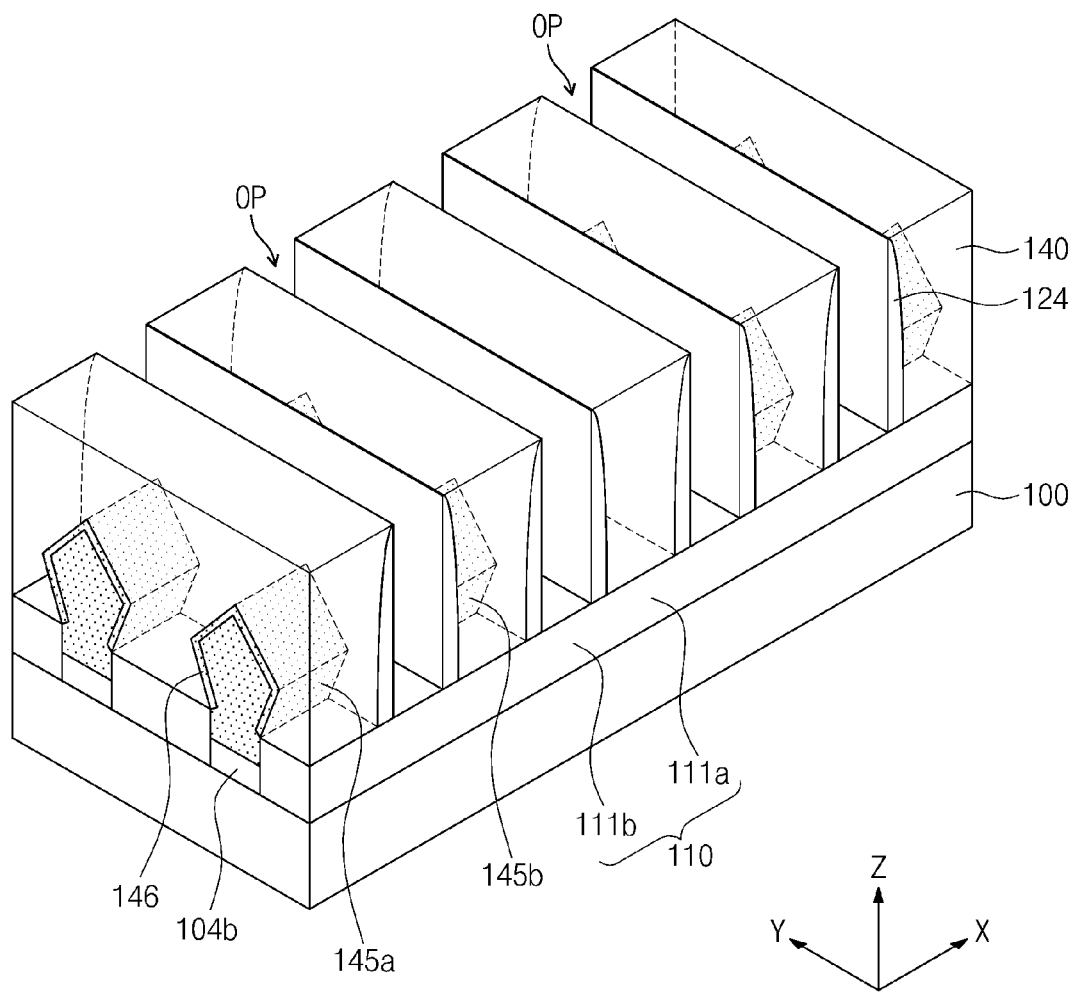
Figure 11B:
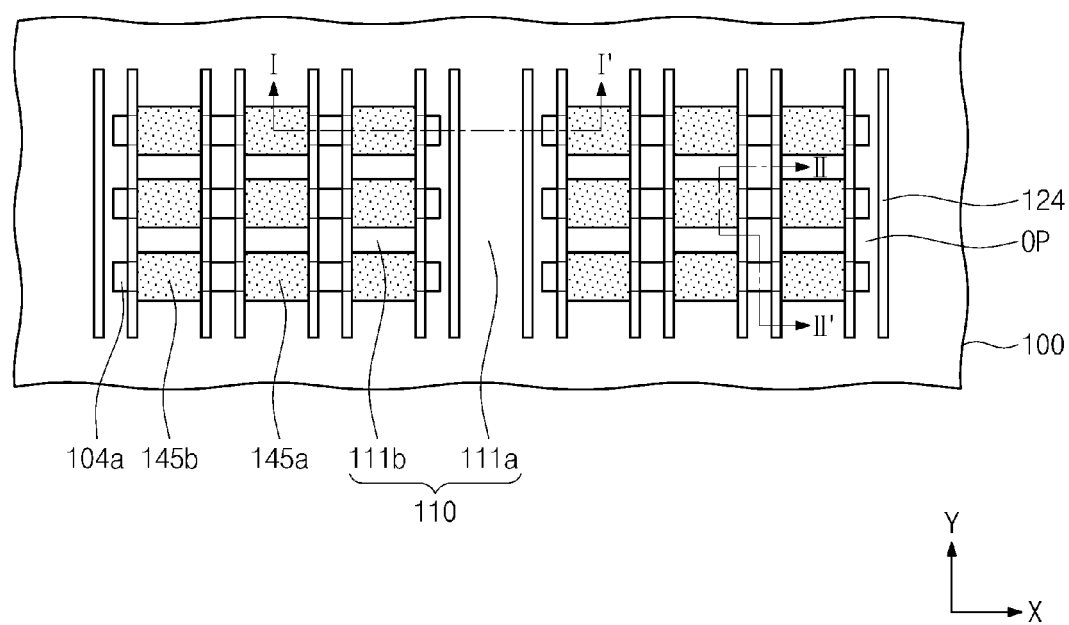
Figure 11C:
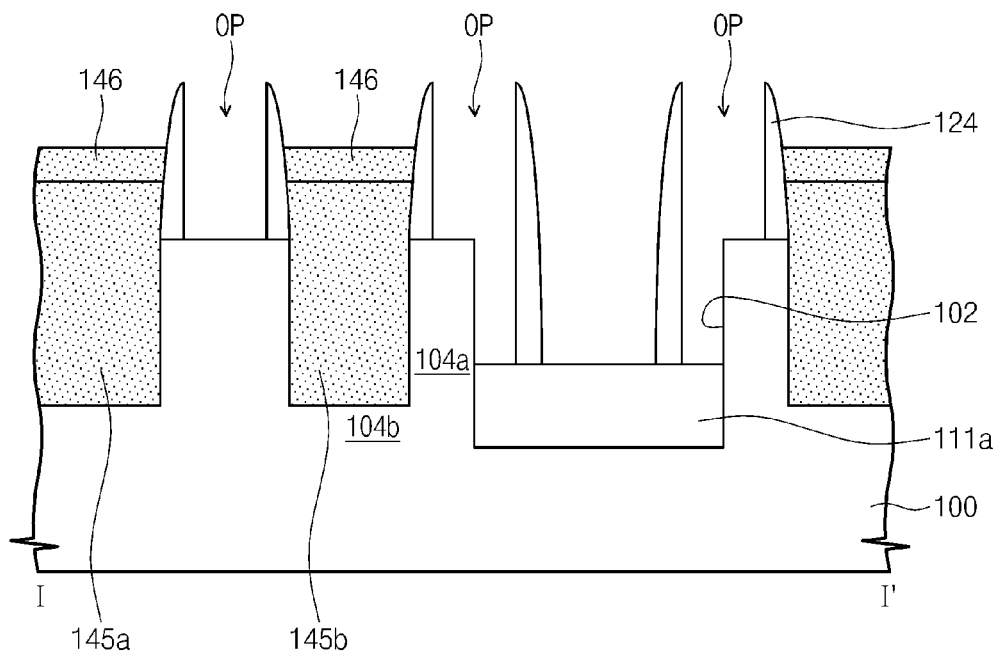
Figure 11D:
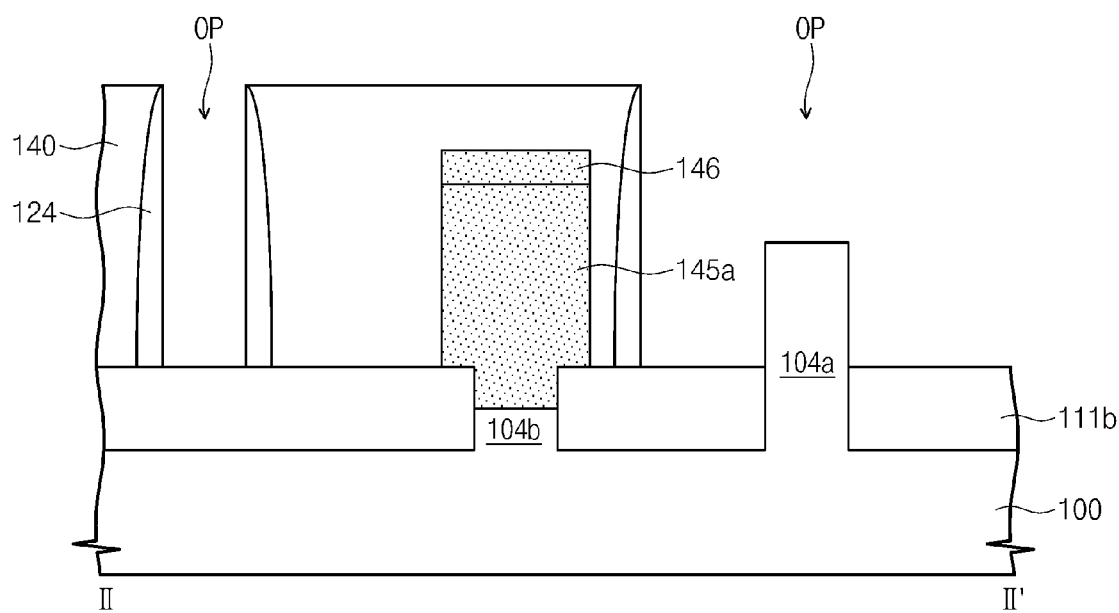
Figure 12A:
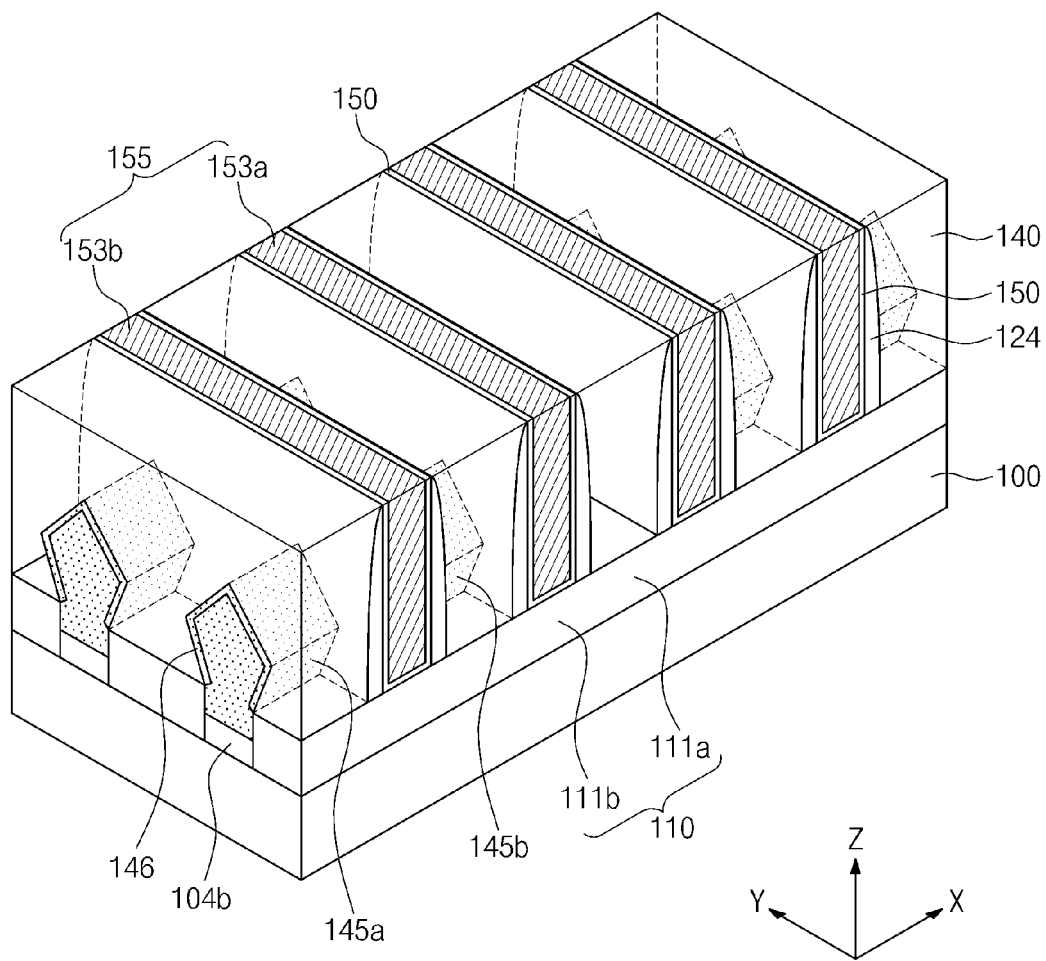
Figure 12B:
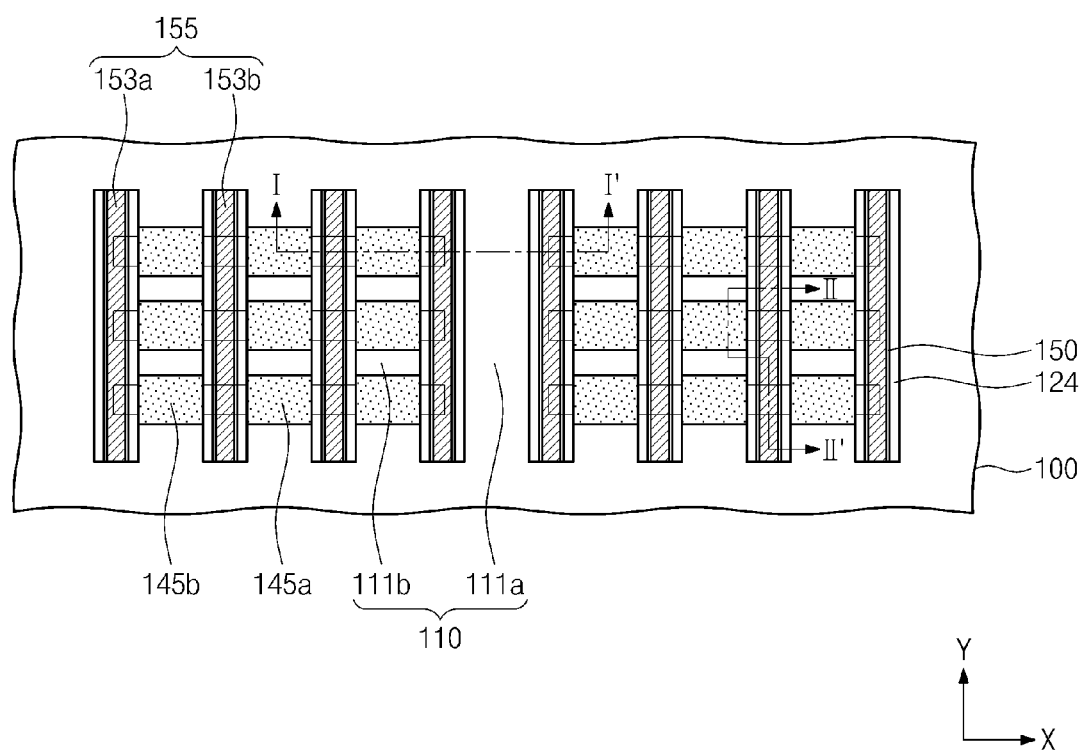
Figure 12C:
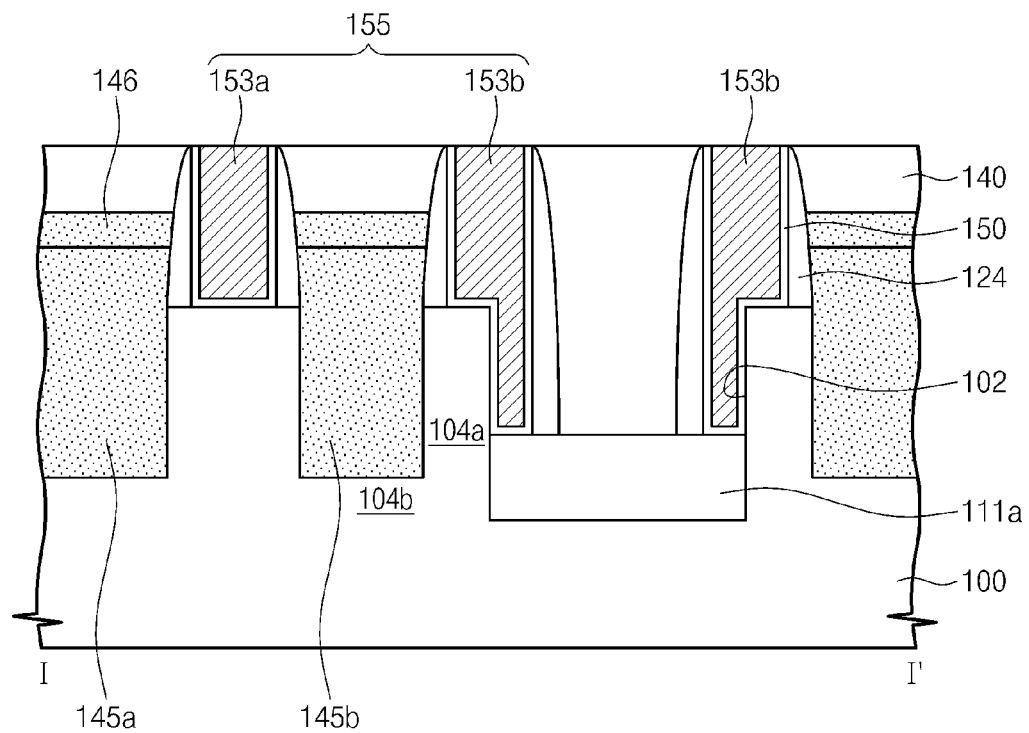
Figure 12D:
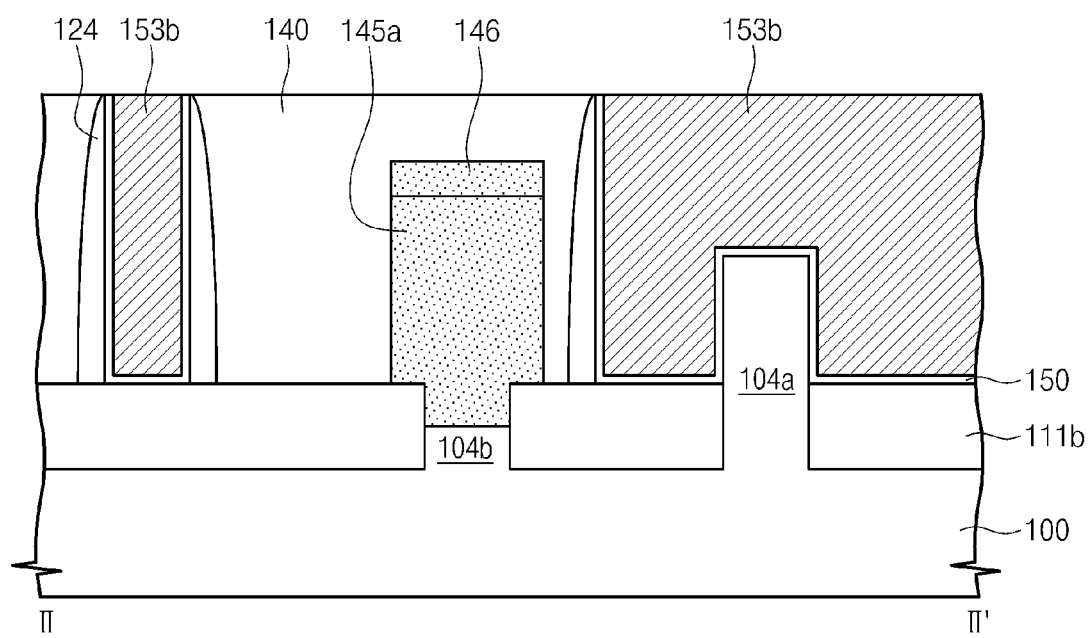
Figure 13A:
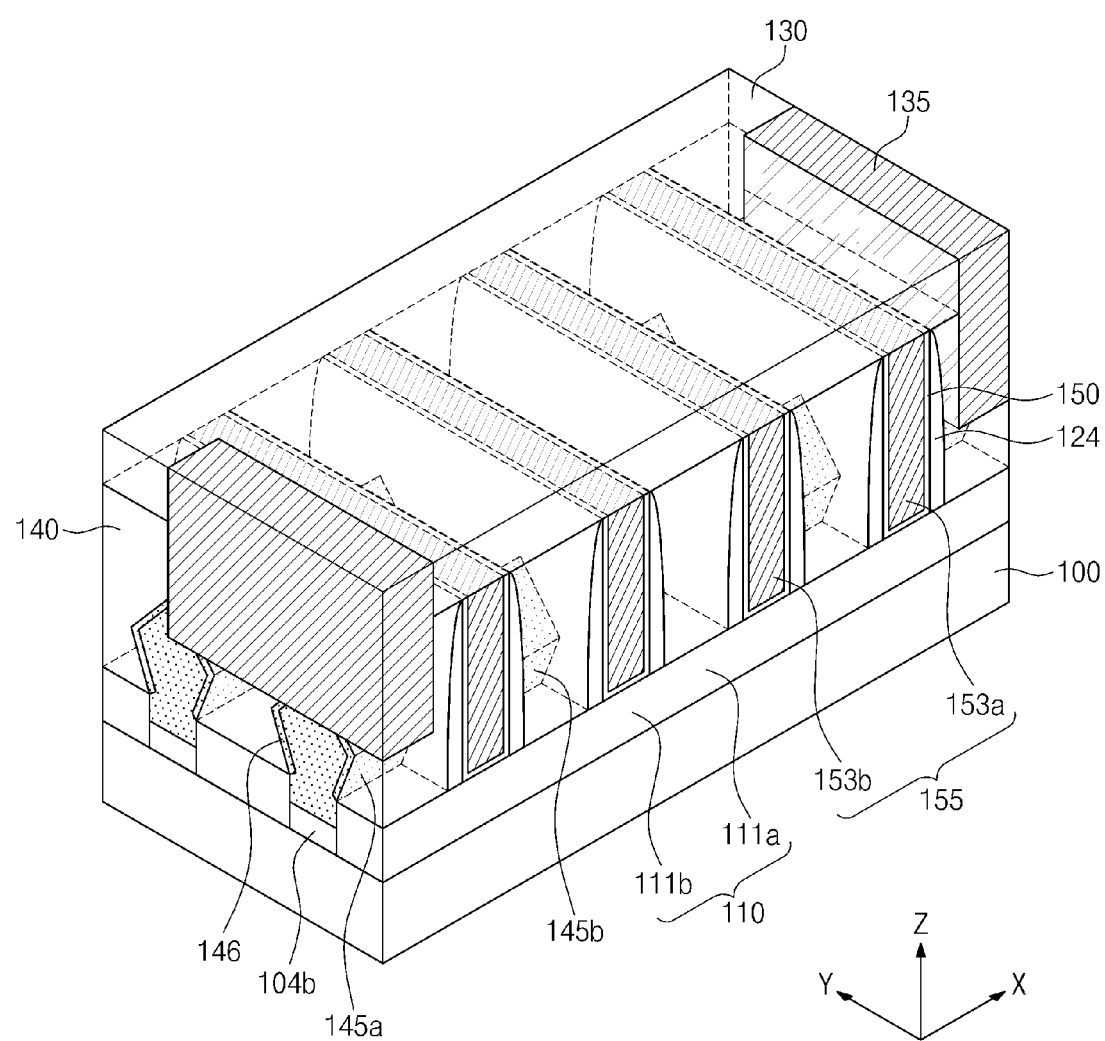
Figure 13B:
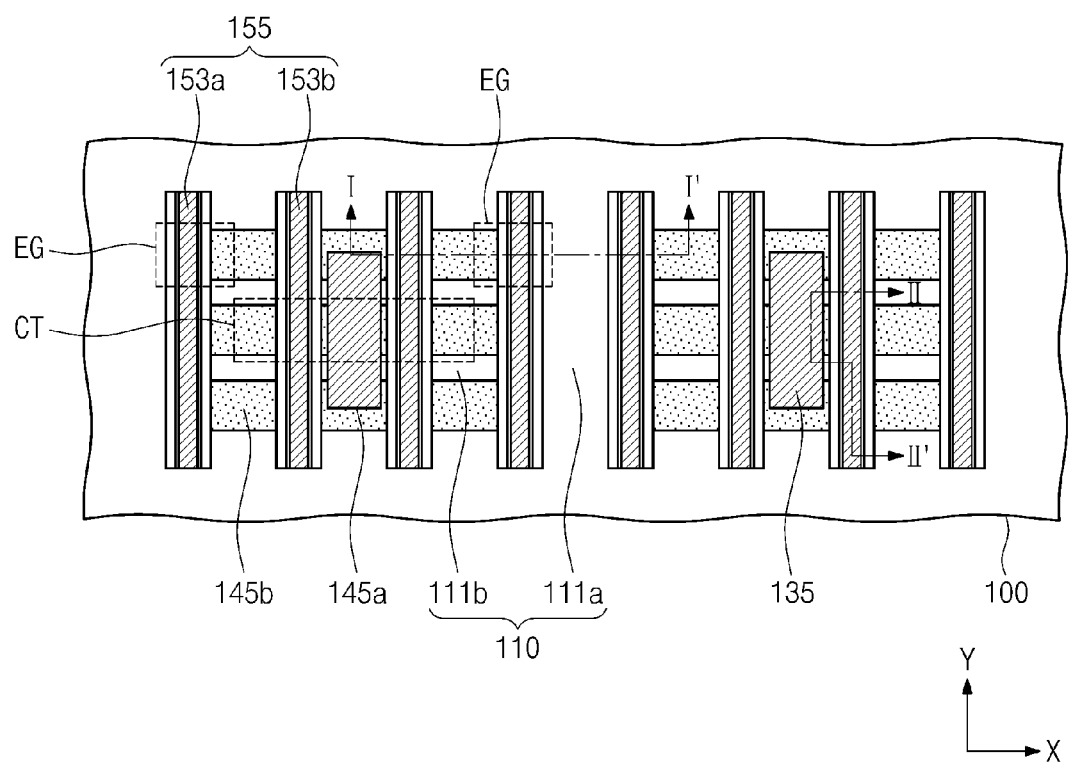
Figure 13C:
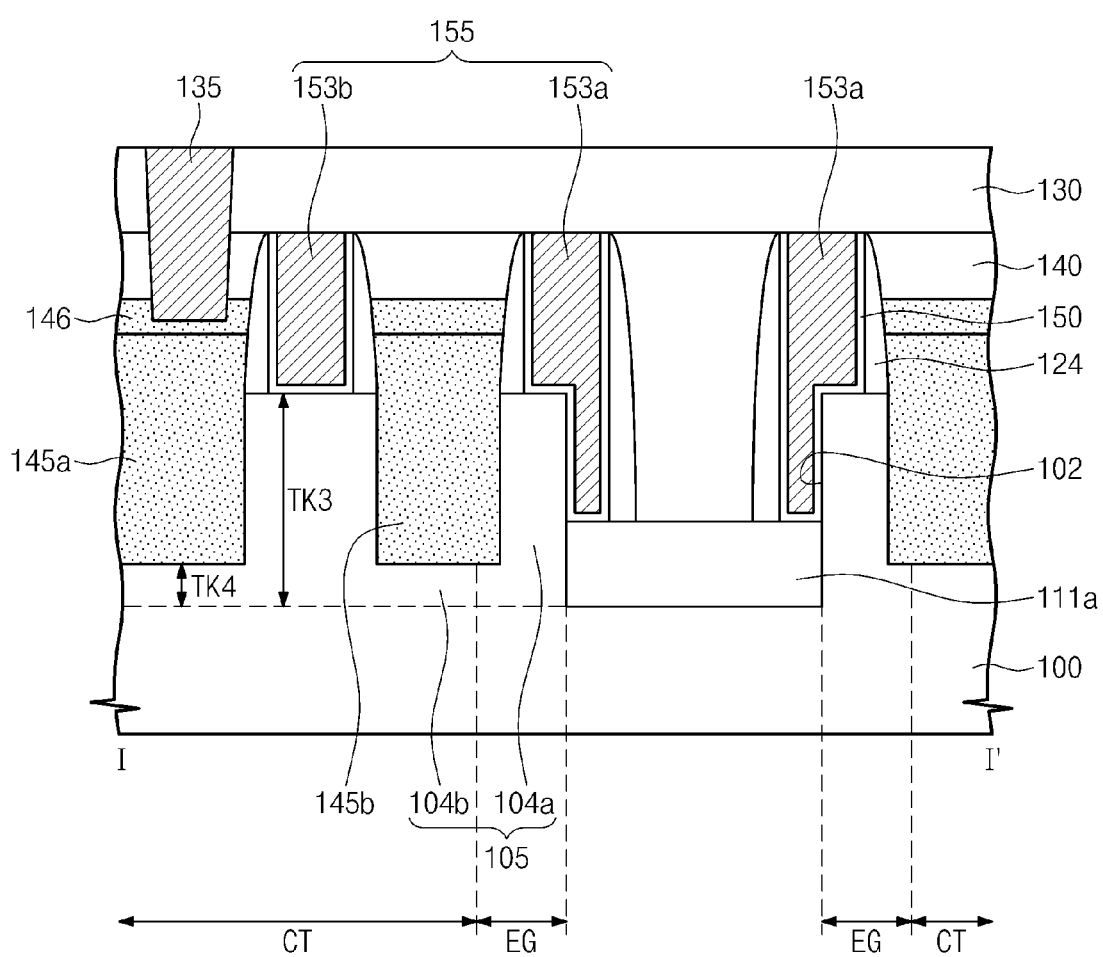
Figure 13D:
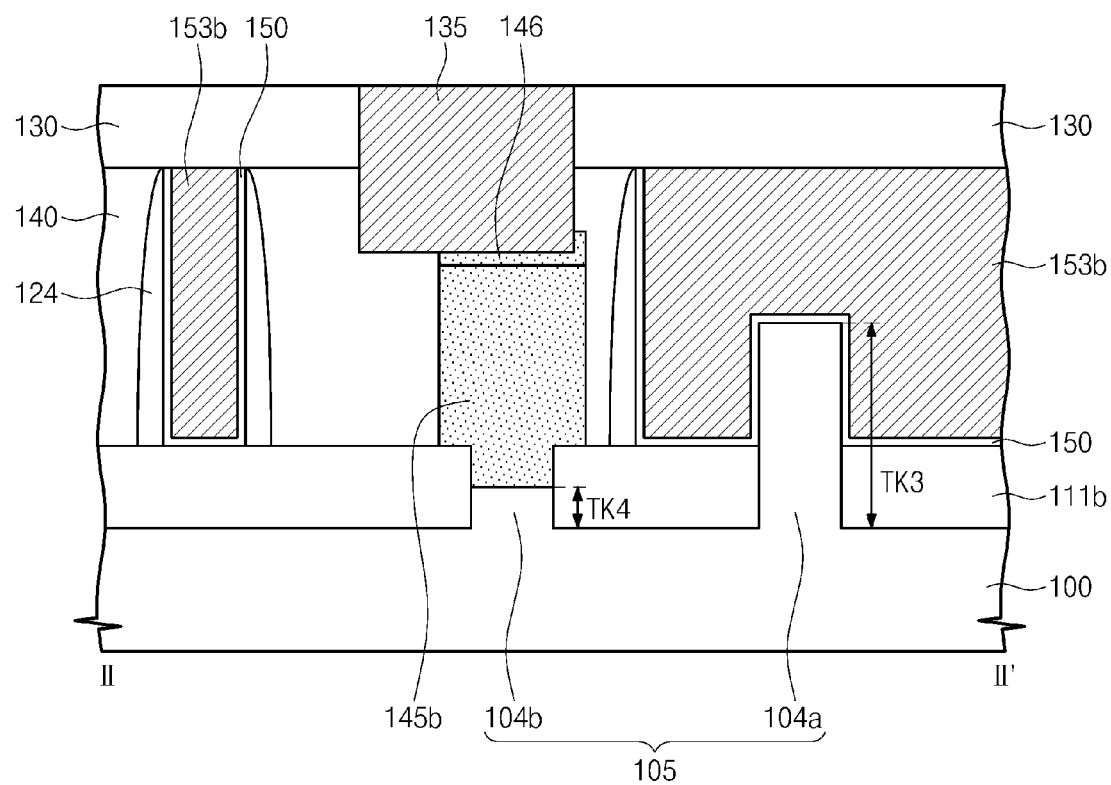

FIG. 3A is a perspective view illustrating a semiconductor device according to other embodiments of the inventive concepts, and FIG. 3B is a plan view illustrating the semiconductor device of FIG. 3A. FIGS. 3C and 3D are cross-sectional views taken along lines I-I' and II-II' of FIG. 3B, respectively.

Referring to FIGS. 3A through 3D, a semiconductor device includes fin-type active patterns 105 and conductive structures on a substrate 100.

The fin-type active patterns 105 may extend in a first direction. Each fin-type active pattern 105 extending in the first direction may include a first portion 104a having a third thickness TK3 and a second portion 104b having a fourth thickness TK4 smaller than the third thickness TK3. Additionally, each fin-type active pattern 105 may include an edge portion EG and a center portion CT. Similar terminology as discussed above may be used to refer to the various elements and features of the embodiments shown in FIGS. 3A through 3D.

The fin-type active patterns 105 may be insulated from each other by a device isolation layer 110. The device isolation layer 110 may include a first device isolation region 111a disposed between the fin-type active patterns 105 adjacent to each other in the first direction, and a second device isolation region 111b disposed between the fin-type active patterns 105 adjacent to each other in a second direction perpendicular to the first direction.

Each conductive structure may include a gate insulating layer 150, a gate line pattern 155, and dopant patterns 145a and 145b.

The gate line patterns 155, individually referred to as gate lines (e.g., 153a or 153b), may extend to cross over the first portions 104a of the fin-type active patterns 105. According to some embodiments of the inventive concepts, the gate line patterns 155 may include a first gate line pattern 153a crossing over the edge portions EG of the fin-type active patterns 105 and the first and second device isolation regions 111a and 111b, and a second gate line pattern 153b crossing over the center portions CT of the fin-type active patterns 105 and the second device isolation region 111b.

The gate line patterns 155 may include a conductive material such as a metal or a metal compound. For example, the gate line patterns 155 may include at least one of titanium nitride (TiN), tantalum nitride (TaN), titanium carbide (TiC), tantalum carbide (TaC), tungsten (W), and aluminum (Al).

The gate insulating layer 150 may be disposed between the fin-type active patterns 105 and the gate line patterns 155. The gate insulating layer 150 may include at least one of silicon oxide and a high-k dielectric material having a dielectric constant higher than that of the silicon oxide. For example, the gate insulating layer 150 may include, but is not limited to, at least one of hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, and lead-zinc niobate.

In some embodiments, the gate insulating layer 150 may surround sidewalls and a bottom surface of each gate line of the gate line pattern 155.

In some embodiments, the conductive structure may further include spacers 124 disposed on both sidewalls of the gate line pattern 155. In some embodiments, the gate insulating layer 150 may extend between the spacer 124 and the gate line pattern 155.

The gate line patterns 155 and the gate insulating layer 150 may be formed, for example, by a replacement process. For example, in the replacement process, the conductive line patterns 125 and the insulating thin layer 120 of FIGS. 1A and 1B may be removed to form openings, and the gate insulating layer 150 and the gate line patterns 155 may be then formed in the openings. In this case, the spacers 124 described with reference to FIGS. 2A to 2D may not be removed. This will be described in more detail later.

The dopant patterns 145a and 145b may be disposed on the second portions 104b of the fin-type active patterns 105. The dopant patterns 145a and 145b may be formed by a selective epitaxial growth process. Top surfaces of the dopant patterns 145a and 145b may be higher than top surfaces of the fin-type active patterns 105 (e.g., top surfaces of the first portions 104a of the fin-type active patterns 105). A cross section of each of the dopant patterns 145a and 145b may have a polygonal shape, an elliptical shape, or a circular shape. In the present embodiment, each of the dopant patterns 145a and 145b has a diamond-shaped cross section. However, the inventive concepts are not limited to the shape of the dopant patterns 145a and 145b.

An ohmic layer 146 may be disposed on each of the dopant patterns 145a and 145b. For example, the ohmic layer 146 may include a metal silicide. The dopant patterns 145a and 145b may include silicon grown from the substrate 100, and a bit line contact plug 135 may include a metal. Thus, the ohmic layer 146 may be formed between the bit line contact plug 135 and the dopant patterns 145a.

The bit line contact plug 135 may electrically connect a bit line BL to the dopant patterns 145a. The bit line BL may be electrically connected to the dopant patterns 145a through the bit line contact plug 135. The bit line BL may extend in the first direction.

The fin-type active patterns 105, the conductive structures, and the bit line contact plug 135 of the present embodiment may be similar to the fin-type active patterns 105, the conductive structures, and the bit line contact plug 135 described with reference to FIGS. 2A to 2D. Thus, the same descriptions as described with reference to FIGS. 2A to 2D are omitted.

FIGS. 4A through 8A are perspective views illustrating a method of manufacturing a semiconductor device according to some embodiments of the inventive concepts. FIGS. 4B through 8B are plan views corresponding to FIGS. 4A through 8A, respectively. FIGS. 4C through 8C are cross-sectional views taken along lines I-I' of FIGS. 4B through 8B, respectively. FIGS. 4D through 8D are cross-sectional views taken along lines II-II' of FIGS. 4B through 8B, respectively.

Referring to FIGS. 4A through 4D, fin-type active patterns 105 may be formed on a substrate 100.

In some embodiments, the substrate 100 may be etched to form a trench 102 defining the fin-type active patterns 105. In other embodiments, the fin-type active patterns 105 protruding in a z-axis direction may be formed using a selective epitaxial growth process on the substrate 100.

According to some embodiments of the inventive concepts, the fin-type active patterns 105 may have linear shape extending in a first direction. For example, the first direction may be an x-axis direction. The fin-type active patterns 105 may constitute a plurality of columns parallel to a second direction perpendicular to the first direction when viewed from a plan view. The fin-type active patterns 105 in one column may be spaced apart from the fin-type active patterns 105 constituting another column adjacent to the one column in the first direction. The fin-type active patterns 105 in each column may be spaced apart from each other in the second direction. For example, the second direction may be a y-axis direction. Each of the fin-type active patterns 105 may protrude from the substrate 100 in a third direction. For example, the third direction may be the z-axis direction.

According to some embodiments of the inventive concepts, the fin-type active pattern 105 may include an edge portion EG adjacent to a neighboring fin-type active pattern 105, and a center portion CT disposed between both edge portions EG.

Referring to FIGS. FIGS. 5A through 5D, a device isolation layer 110 may be formed in the trench 102 defining the fin-type active patterns 105. The device isolation layer 110 may include at least one of an oxide (e.g., silicon oxide), a nitride (e.g., silicon nitride), and an oxynitride (e.g., silicon oxynitride).

In more detail, an insulating layer may be formed to completely fill the trench 102, and the insulating layer may be etched to expose top surfaces of the fin-type active patterns 105. The insulating layer may be etched, for example, by a polishing process or a blanket etching process. The etched insulating layer may be further etched to form the device isolation layer 110 filling a lower region of the trench 102.

According to some embodiments of the inventive concepts, the device isolation layer 110 insulates the fin-type active patterns 105 from each other. The device isolation layer 110 may include a first device isolation region 111a disposed between the fin-type active patterns 105 spaced apart from each other in the first direction, and a second device isolation region 111b disposed between the fin-type active patterns 105 spaced apart from each other in the second direction.

Referring to FIGS. 6A through 6D, an insulating thin layer 120 may be conformally formed on the fin-type active patterns 105 and the device isolation layer 110. The insulating thin layer 120 may include, for example, an oxide. This layer may also be referred to herein as a conformal insulating layer, or more generally an insulating layer. This insulating layer 120 may therefore cover top and side surfaces of the fin-type active patterns 105 as well as top surfaces of the device isolation regions 111a and 111b.

In some embodiments, the insulating thin layer 120 may be formed by a deposition process. In other embodiments, the insulating thin layer 120 may be formed by a thermal oxidation process when the fin-type active patterns 105 include silicon. In this case, the insulating thin layer 120 may include silicon oxide.

Referring to FIGS. 7A through 7D, conductive line patterns 125 crossing over the fin-type active patterns 105 may be formed on the insulating thin layer 120. In some embodiments, the conductive line patterns 125 may extend in the second direction.

In more detail, a conductive layer may be formed on the insulating thin layer 120. In some embodiments, the conductive layer may include poly-silicon. Mask patterns 122 may be formed on the conductive layer. The conductive layer may be etched using the mask patterns 122 as an etch mask, thereby forming the conductive line patterns 125.

According to some embodiments of the inventive concepts, the conductive line patterns 125 may include a first conductive line patterns 123a crossing over the edge portions EG of the fin-type active patterns 105 and the first and second device isolation regions 111a and 111b, and a second conductive line patterns 123b crossing over the center portions CT of the fin-type active patterns 105 and the second device isolation region 111b.

After the formation of the conductive line patterns 125, spacers 124 may be formed on sidewalls of the conductive line patterns 125 and the mask patterns 122.

In some embodiments, dopants may be injected into the fin-type active patterns 105 exposed by the conductive line patterns 125, thereby forming dopant regions 127a and 127b. The dopant regions 127a and 127b at both sides of one conductive line pattern 125 may function as source/drain regions.

Thus, conductive structures may be formed on the fin-type active patterns 105. Each of the conductive structures may include the insulating thin layer 120 and the conductive line pattern 125. The conductive structure may function as a transistor having a three-dimensional channel region. In some embodiments, the insulating thin layer 120 may function as a gate insulating layer of the transistor, and the conductive line pattern 125 may function as a gate electrode of the transistor. As described above, the dopant regions 127a and 127b may function as the source/drain regions of the transistor.

In the present embodiment, four conductive line patterns 125 are illustrated. Two second conductive line patterns 123b (e.g., two conductive lines) crossing over the center portion CT of the fin-type active pattern 105 may function as the gate electrodes of the transistor structures TR for the read operation illustrated in FIG. 1A. Two first conductive line patterns 123a (e.g., two conductive lines) crossing over the both edge portions EG of the fin-type active pattern 105 may function as the gate electrodes of the transistor structures TW for the write operation illustrated in FIG. 1A, and thus may function as gate electrodes for an anti-fuse to be broken down upon applying a write operation voltage.

Referring to FIGS. 8A through 8D, a bit line contact plug 135 may be formed to be electrically connected to the dopant regions 127a of the fin-type active patterns 105.

In more detail, an interlayer insulating layer 130 may be formed on the conductive structures. The interlayer insulating layer 130 may fill spaces between the conductive structures. The interlayer insulating layer 130 may be etched to form a contact hole exposing the dopant regions 127a formed in upper portions of the fin-type active patterns 105. The etching process may over-etch the dopant regions 127a formed in the upper portions of the fin-type active patterns 105 and an upper portion of the second device isolation region 111b.

The contact hole may expose the dopant regions 127a and the second device isolation region 11b that are disposed between the two second conductive line patterns 123b crossing over the center portions CT of the fin-type active patterns 105. Subsequently, the contact hole may be filled with a conductive material, thereby forming the bit line contact plug 135. The bit line contact plug 135 may be electrically connected to the dopant regions 127a of the fin-type active patterns 105.

The bit line BL illustrated in FIGS. 2A through 2D may be formed on the bit line contact plug 135. In a further step, a breakdown region in the insulating thin layer 120 may be formed upon application of a high enough voltage, such as a write voltage. As such, a corner gate structured anti-fuse including a first conductive line pattern 123a may be programmed.

FIGS. 9A through 13A are perspective views illustrating a method of manufacturing a semiconductor device according to other embodiments of the inventive concepts. FIGS. 9B through 13B are plan views corresponding to FIGS. 9A through 13A, respectively. FIGS. 9C through 13C are cross-sectional views taken along lines I-I' of FIGS. 9B through 13B, respectively. FIGS. 9D through 13D are cross-sectional views taken along lines II-II' of FIGS. 9B through 13B, respectively.

Referring to FIGS. 9A through 9D, conductive structures may be formed on a substrate 100. The conductive structures may include fin-type active patterns 105, an insulating thin layer 120, conductive line patterns 125, mask patterns 122 and spacers 124. The fin-type active patterns 105 may protrude from a top surface of the substrate 100. Each of the fin-type active patterns 105 may have a third thickness TK3 from the top surface of the substrate 100 to a top surface of the fin-type active pattern 105.

The conductive structures may be formed by the same method as described with reference to FIGS. 3A to 6A, 3B to 6B, 3C to 6C, and 3D to 6D.

Next, the fin-type active patterns 105 exposed by the conductive line patterns 125 may be partially etched. Thus, each of the etched portions of the fin-type active patterns 105 may have a fourth thickness TK4 smaller than the third thickness TK3. For the purpose of ease and convenience in explanation, a portion of the fin-type active pattern 105, which have the third thickness TK3 under the conductive line pattern 125, is defined as a first portion 104a of the fin-type active pattern 105. A portion of the fin-type active pattern 105, which has the fourth thickness TK4, is defined as a second portion 104b of the fin-type active pattern 105.

Referring to FIGS. 10A through 10D, dopant patterns 145a and 145b may be formed on the second portions 104b of the fin-type active patterns 105.

In some embodiments, the dopant patterns 145a and 145b may be formed by performing a selective epitaxial growth process on the second portions 104b of the fin-type active patterns 105. In some embodiments, a process of injecting dopants may be performed in-situ during the selective epitaxial growth process. In other embodiments, the process of injecting dopants may be performed after the selective epitaxial growth process.

Subsequently, an ohmic layer 146 may be formed on each of the dopant patterns 145a and 145b. The ohmic layer 146 may include, for example, a metal silicide.

Referring to FIGS. 11A through 11D, a first interlayer insulating layer 140 may be formed on the substrate 100 having the ohmic layer 146 and the conductive structures. Next, the mask patterns 122, the conductive line patterns 125, and the insulating thin layer 120 may be removed. Thus, openings OP may be formed to expose the fin-type active patterns 105 between the spacers 124.

Referring to FIGS. 12A through 12D, a gate insulating layer 150 and gate line patterns 155 may be sequentially formed in the openings OP.

The gate insulating layer 150 may be conformally formed on the fin-type active patterns 105 and the spacers 124. Thus, the gate insulating layer 150 may partially fill the openings OP. The gate insulating layer 150 may include at least one of silicon oxide and a high-k dielectric material. In some embodiments, the gate insulating layer 150 may include, but is not limited to, at least one of hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, and lead-zinc niobate.

Next, a gate electrode layer (not shown) may be formed to fill the openings OP having the gate insulating layer 150. Even though not shown in the drawings, the gate electrode layer may have a multi-layered structure. For example, the gate electrode layer may include a lower electrode layer and an upper electrode layer. The lower electrode layer may control a work function and may include at least one of at least one of titanium nitride (TiN), tantalum nitride (TaN), titanium carbide (TiC), and tantalum carbide (TaC). The upper electrode layer may include at least one of tungsten (W) and aluminum (Al). The gate electrode layer may be planarized to form the gate line patterns 155 in the openings OP, respectively.

Referring to FIGS. 13A through 13D, a second interlayer insulating layer 130 may be formed to cover the gate line patterns 155 and the first interlayer insulating layer 140. Subsequently, a bit lint contact plug 135 may be formed to be electrically connected to the dopant patterns 145a on which the ohmic layers 146 are formed.

The bit line BL illustrated in FIGS. 3A through 3D may be formed on the bit line contact plug 135.

According to embodiments of the inventive concepts, the gate electrode of the transistor structure, on which the write operation is performed, may be formed to cross over the edge portion of the fin-type active pattern. Thus, the gate insulating layer may be broken by the low voltage. As a result, the size of charge pump may be reduced, so that the entire area of the semiconductor device may be reduced.

Additionally, the gate electrode of the transistor structure for the write operation may be formed in place of a dummy pattern may. Thus, the area of the bit array may be reduced to increase the number of the redundant bits.

The transistor structures and other structures described herein may have many applications. For example, as described previously, in certain embodiments they may be used to implement OTP devices, such as fuse or anti-fuse structures. Such structures may be included in a memory system, such as a DRAM, NAND flash, MRAM, FRAM, RRAM, or other volatile or non-volatile memory device that uses addressing to access memory locations. In addition, the structures described herein may be implemented as part of a single chip memory device, a multi-chip, stacked memory device, a packaged memory device including one or more chips stacked on a package substrate, a package-on-package device, a memory module, or other types of memory systems.

While the disclosure has been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor device comprising:
a substrate;
a device isolation layer on the substrate;
a fin-type active pattern defined by the device isolation layer, the fin-type active pattern extending lengthwise in a first direction, the fin-type active pattern having a first edge portion, a center portion, and a second edge portion opposite the first edge portion, wherein the first edge portion, the center portion, and the second edge portion are arranged sequentially in the first direction, and the fin-type active pattern having a top surface higher than a top surface of the device isolation layer;
a first conductive line on the first edge portion of the fin-type active pattern and on the device isolation layer adjacent to the first edge portion of the fin-type active pattern; and
an insulating thin layer between the fin-type active pattern and the first conductive line,
wherein the first conductive line covers at least a first point corner portion of the fin-type active pattern.

2. The semiconductor device of claim 1, further comprising:
a second conductive line on the center portion of the fin-type active pattern.

3. The semiconductor device of claim 2, wherein the second conductive line forms a gate electrode on which a read operation is performed.

4. The semiconductor device of claim 3, further comprising:
dopant regions in the fin-type active pattern exposed by the first and second conductive lines; and
a bit line electrically connected to the dopant region adjacent to the second conductive line.

5. The semiconductor device of claim 4, wherein the insulating thin layer under the first conductive line is configured to break in order to electrically connect the first conductive line to the fin-type active pattern when a ground voltage is applied to the first conductive line and the substrate, a first voltage is applied to the first conductive line, and a second voltage lower than the first voltage is applied to the second conductive line.

6. The semiconductor device of claim 1, wherein the fin-type active pattern is a first fin-type active pattern of a plurality of fin-type active patterns,
wherein the plurality of fin-type active patterns constitute a plurality of columns parallel to a second direction perpendicular to the first direction,
wherein fin-type active patterns constituting one column are spaced apart from fin type active patterns constituting another column in the first direction, and
wherein the fin-type active patterns in each column are spaced apart from each other in the second direction.

7. The semiconductor device of claim 6, wherein the device isolation layer includes a first device isolation region between fin-type active patterns adjacent to each other in the first direction, and a second device isolation region between fin-type active patterns adjacent to each other in the second direction.

8. The semiconductor device of claim 7, wherein the first conductive line crosses over the edge portion of the first fin-type active pattern and the first device isolation region, the semiconductor device further comprising:
a second conductive line crossing over the center portion of the fin-type active pattern and the second device isolation region.

9. The semiconductor device of claim 1, wherein the fin-type active pattern includes a first portion having a first height from the substrate and a second portion having a second height smaller than the first height from the substrate, and
wherein the first conductive line is disposed on the first portion of the fin-type active pattern,
the semiconductor device further comprising:
a dopant pattern disposed on the second portion of the fin-type active pattern.

10. The semiconductor device of claim 9, wherein the insulating thin layer surrounds a bottom surface and opposite sidewalls of the first conductive line.

11. A semiconductor device comprising:
a substrate;
a device isolation layer on the substrate;
a plurality of fin-type active patterns, including a first fin-type active pattern, defined by the device isolation layer, the first fin-type active pattern extending lengthwise in a first direction parallel to an upper surface of the substrate, the fin-type active pattern having a first edge portion, a center portion, and a second edge portion opposite the first edge portion, wherein the first edge portion, the center portion, and the second edge portion are arranged sequentially in the first direction, and the first fin-type active pattern having a top surface higher than a top surface of the device isolation layer;
a first conductive line disposed on the first edge portion of the first fin-type active pattern and on the device isolation layer adjacent to the first edge portion of the first fin-type active pattern, the first conductive line continuously covering a top surface of the first edge portion of the first fin-type active pattern and a terminal edge between the top surface of the first edge portion and an end sidewall of the first edge portion; and
an insulating layer between the first fin-type active pattern and the first conductive line.

12. The semiconductor device of claim 11, wherein:
the first conductive line covers at least a first point corner portion of the first fin-type active pattern.

13. The semiconductor device of claim 12, wherein:
the insulating layer is configured to break at a region corresponding to the first point corner portion of the first fin-type active pattern when a voltage above a particular threshold is applied to the first conductive line.

14. The semiconductor device of claim 12, wherein the insulating layer is conformally formed on the first fin-type active pattern.

15. The semiconductor device of claim 12, wherein the insulating layer is conformally formed on the first conductive line.

16. The semiconductor device of claim 12, wherein the first conductive line and insulating layer are part of an anti-fuse, and
wherein the first conductive line is a gate electrode of the anti-fuse.

17. The semiconductor device of claim 11, wherein:
the first conductive line covers at least a first point corner portion of the first fin-type active pattern, and
the insulating layer is configured to break at a region corresponding to the first point corner portion of the first fin-type active pattern when a voltage above a particular threshold is applied to the first conductive line.

18. A semiconductor device comprising:
a substrate including a device isolation layer defining active patterns, the device isolation layer having a top surface lower than top surfaces of the active patterns;
a first anti-fuse including a first gate electrode crossing over the active patterns on edge portions of the active patterns, the first gate electrode for receiving a first voltage;
a first transistor including a second gate electrode crossing over center portions of the active patterns, the second gate electrode for receiving a second voltage lower than the first voltage; and
a bit line electrically connected to the first transistor,
wherein the first gate electrode includes a first portion on the active patterns and a second portion on the device isolation layer, and
wherein the first anti-fuse covers at least a first point corner portion of the active patterns.

19. The semiconductor device of claim 18, wherein the first anti-fuse further comprises: a first insulating layer between the substrate and the first gate electrode; and a first dopant pattern at one side of the first gate electrode,
wherein the first transistor further includes: a second insulating layer between the substrate and the second gate electrode; and second dopant patterns at opposite sides of the second gate electrode, and
wherein the first insulating layer is broken such that the first transistor is one-time programmed when the first and second voltages are applied to the first and second gate electrodes, respectively.

20. The semiconductor device of claim 19, wherein the first and second dopant patterns have top surfaces higher than top surfaces of the active patterns disposed under the first and second gate electrodes.

21. The semiconductor device of claim 18, the first gate electrode continuously covering top surfaces of the edge portions of the active patterns, end sidewalls of the edge portions of the active patterns, and terminal edges respectively between each top surface and each end sidewall.

* * * * *